United States Patent
Nath et al.

(10) Patent No.: US 9,164,159 B2
(45) Date of Patent: Oct. 20, 2015

(54) METHODS FOR VALIDATING RADIO-FREQUENCY TEST STATIONS

(71) Applicant: Apple Inc., Cupertino, CA (US)

(72) Inventors: Jayesh Nath, Milpitas, CA (US); Liang Han, Sunnyvale, CA (US); Matthew A. Mow, Los Altos, CA (US); Ming-Ju Tsai, Cupertino, CA (US); Joshua G. Nickel, San Jose, CA (US); Hao Xu, Cupertino, CA (US); Peter Bevelacqua, San Jose, CA (US); Mattia Pascolini, Campbell, CA (US); Robert W. Schlub, Cupertino, CA (US); Ruben Caballero, San Jose, CA (US)

(73) Assignee: Apple Inc., Cupertino, CA (US)

( * ) Notice: Subject to any disclaimer, the term of this patent is extended or adjusted under 35 U.S.C. 154(b) by 362 days.

(21) Appl. No.: 13/715,648

(22) Filed: Dec. 14, 2012

(65) Prior Publication Data

US 2014/0167794 A1    Jun. 19, 2014

(51) Int. Cl.
*G01R 35/00*   (2006.01)
*G01R 31/319*  (2006.01)
*G01R 31/28*   (2006.01)

(52) U.S. Cl.
CPC .......... *G01R 35/007* (2013.01); *G01R 31/2822* (2013.01); *G01R 31/2879* (2013.01); *G01R 31/3191* (2013.01)

(58) Field of Classification Search
CPC ............. G01R 31/3191; G01R 35/005; G01R 31/2879; G01R 31/2822; H01L 2924/0002
USPC ................................................... 324/750.02
See application file for complete search history.

(56) References Cited

U.S. PATENT DOCUMENTS

| | | | |
|---|---|---|---|
| 4,669,485 A | * | 6/1987 | Russell ......................... 600/492 |
| 4,724,378 A | | 2/1988 | Murray et al. |
| 5,262,716 A | * | 11/1993 | Gregory et al. .......... 324/750.02 |
| 5,477,137 A | * | 12/1995 | Staudinger et al. ...... 324/754.03 |

(Continued)

OTHER PUBLICATIONS

Federal Register / vol. 79, No. 241 / Tuesday, Dec. 16, 2014 / Rules and Regulations.*

(Continued)

*Primary Examiner* — Jermele M Hollington
*Assistant Examiner* — Christopher McAndrew
(74) *Attorney, Agent, or Firm* — Treyz Law Group; Michael H. Lyons

(57) ABSTRACT

A manufacturing system for assembling wireless electronic devices is provided. The manufacturing system may include test stations for testing the radio-frequency performance of components that are to be assembled within the electronic devices. A reference test station may be calibrated using calibration coupons having known radio-frequency characteristics. The calibration coupons may include transmission line structures. The reference test station may measure verification standards to establish baseline measurement data. The verification standards may include circuitry having electrical components with given impedance values. Many verification coupons may be measured to enable testing for a wide range of impedance values. Test stations in the manufacturing system may subsequently measure the verification standards to generate test measurement data. The test measurement data may be compared to the baseline measurement data to characterize the performance of the test stations to ensure consistent test measurements across the test stations.

20 Claims, 13 Drawing Sheets

(56) References Cited

U.S. PATENT DOCUMENTS

| | | | |
|---|---|---|---|
| 5,539,305 A * | 7/1996 | Botka | 324/750.02 |
| 5,590,136 A * | 12/1996 | Firooz | 714/736 |
| 6,133,727 A * | 10/2000 | Chun et al. | 324/750.02 |
| 6,300,757 B1 * | 10/2001 | Janssen | 324/750.02 |
| 6,519,539 B1 * | 2/2003 | Freeman et al. | 702/65 |
| 6,566,883 B1 * | 5/2003 | Vonderhaar et al. | 324/426 |
| 6,594,594 B1 * | 7/2003 | Tsai | 702/65 |
| 6,795,782 B2 * | 9/2004 | Bertness et al. | 702/63 |
| 6,828,778 B2 | 12/2004 | Jacobsen et al. | |
| 6,889,147 B2 * | 5/2005 | Gopal et al. | 702/63 |
| 7,039,533 B2 * | 5/2006 | Bertness et al. | 702/63 |
| 7,054,780 B2 * | 5/2006 | Dunsmore et al. | 702/117 |
| 7,058,525 B2 * | 6/2006 | Bertness et al. | 702/63 |
| 7,108,424 B2 | 9/2006 | Heumann et al. | |
| 7,194,367 B2 * | 3/2007 | Baker | 702/85 |
| 7,197,416 B2 * | 3/2007 | Adachi et al. | 702/119 |
| 7,269,810 B1 | 9/2007 | Weller et al. | |
| 7,505,856 B2 * | 3/2009 | Restaino et al. | 702/63 |
| 7,852,094 B2 * | 12/2010 | Chraft et al. | 324/754.07 |
| 8,330,097 B2 * | 12/2012 | Kikawa et al. | 250/231.13 |
| 2003/0045989 A1 * | 3/2003 | Walenty et al. | 701/71 |
| 2003/0182180 A1 * | 9/2003 | Zarrow | 705/11 |
| 2003/0184307 A1 * | 10/2003 | Kozlowski et al. | 324/427 |
| 2008/0157804 A1 * | 7/2008 | Kushnick et al. | 324/763 |
| 2009/0315581 A1 * | 12/2009 | Rumiantsev et al. | 324/760 |
| 2011/0131030 A1 | 6/2011 | McCoy et al. | |
| 2011/0208467 A1 * | 8/2011 | Tang | 702/117 |
| 2011/0301905 A1 | 12/2011 | Gregg et al. | |
| 2013/0187674 A1 * | 7/2013 | Rada et al. | 324/750.02 |

OTHER PUBLICATIONS

STIC Search Report.*

* cited by examiner

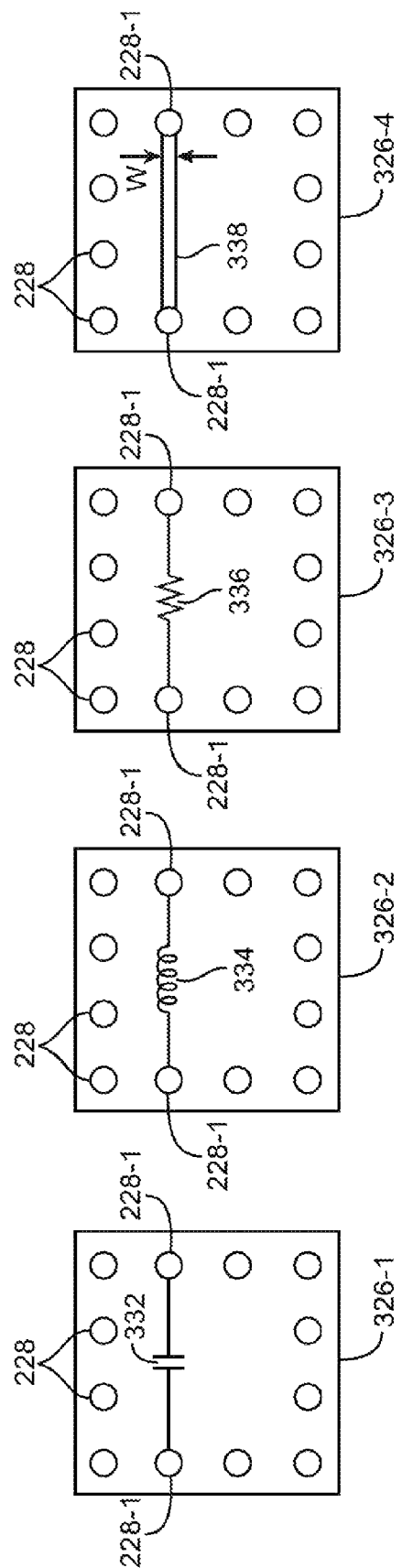

METHODS FOR VALIDATING RADIO-FREQUENCY TEST STATIONS

BACKGROUND

This relates generally to wireless communications circuitry, and more particularly, to electronic devices having wireless communications circuitry.

Wireless electronic devices such as portable computers and cellular telephones are often provided with wireless communications circuitry that includes a number of electric components. The electric components are assembled in a manufacturing system to produce the wireless communications circuitry. A given electric component is typically tested using a test station in the manufacturing system prior to assembly within an electronic device. To expedite the manufacturing process, many test stations can be used to test the given electric component in parallel (i.e., to determine whether the electric component under test has been manufactured properly or whether the electric component under test satisfies design criteria).

Each test station that is used to test the given component typically experiences measurement variation due to variations between individual test stations. The behavior of each test station is typically unique, as it is challenging to manufacture test stations that are exactly identical to one another. It is challenging to limit variation between test stations within a single manufacturing system as well as across a number of manufacturing systems formed at different locations. Variations between individual test stations make it difficult to provide consistent testing for each component under test.

It would therefore be desirable to be able to provide improved test systems for testing wireless electronic devices

SUMMARY

A wireless electronic device may include a number of components such as wireless communications circuitry, antenna circuitry, and storage and processing circuitry. The components in the wireless electronic device may be assembled using a manufacturing system. The manufacturing system may include test stations to test the performance of components under test before fully assembling the wireless electronic device.

The test stations may perform radio-frequency testing on a number of passive reference test structures. The passive reference test structures may include calibration reference structures and verification reference structures. Calibrated test stations may be referred to as reference test stations or master test stations. At least one reference test station may be calibrated using a number of calibration reference structures (sometimes referred to as calibration "coupons") having reference data such as predetermined radio-frequency characteristics. The calibration coupons may include conductive contacts, transmission line structures, and a group of electrical components formed on a substrate. The reference test stations may include a tester that measures radio-frequency characteristics of the calibration coupons using test probes. The reference test station may measure radio-frequency characteristics associated with the transmission line structures and the group of electrical components.

A number of different calibration coupons each having different transmission line structures and/or different groups of electrical components may be tested by the reference test station. The radio-frequency characteristics associated with the transmission line structures and/or the groups of electrical components in the calibration coupons may be measured using a THRU-REFLECT-LINE (TRL) method. The radio-frequency characteristics associated with the calibration coupons may be scattering parameters. The reference test stations may be calibrated to remove systematic errors associated with the tester and test probes. The measured radio-frequency characteristics of the calibration coupons may be compared to the predetermined radio-frequency characteristics (e.g., predetermined scattering parameters) of the calibration coupons to calibrate the reference test station.

In another arrangement, an additional reference test station at a different location may also measure the radio-frequency characteristics associated with each calibration coupon to obtain additional test data. The additional test data measured by the additional reference test station may be compared to the measured radio-frequency characteristics (e.g., calibration measurement data) obtained by a given reference test station to calibrate the given reference test station.

The calibrated reference test stations may test a number of verification reference structures (sometimes referred to as verification coupons) to establish baseline measurement data. The baseline measurement data may serve as reference data for verifying the performance of the test stations. The verification coupons may include conductive contacts and impedance modeling circuitry formed on a substrate. The impedance modeling circuitry may include electrical components that model the impedance of a component under test. The electrical components may be connected between the conductive contacts in shunt configurations, series configurations, or shunt and series configurations.

Each test station may obtain test measurement data (sometimes referred to as verification measurement data) by testing the verification coupons. The test measurement data may include scattering parameters associated with the verification coupons that are measured after test signals are applied to the verification coupons. The verification coupons may be used to determine whether each test station is capable of obtaining accurate test measurement data by comparing the test measurement data to the baseline measurement (reference) data. The reference test station may remove systematic errors associated with the substrate and the conductive contacts of the verification coupons by calibrating the reference test stations with the calibration coupons.

Further features of the present invention, its nature and various advantages will be more apparent from the accompanying drawings and the following detailed description.

BRIEF DESCRIPTION OF THE DRAWINGS

FIGS. 11A-11D are diagrams of verification coupons that may be formed having electrical components in a series configuration for testing inspection test stations at a wide range of impedances in accordance with an embodiment of the present invention.

DETAILED DESCRIPTION

Figure 1:
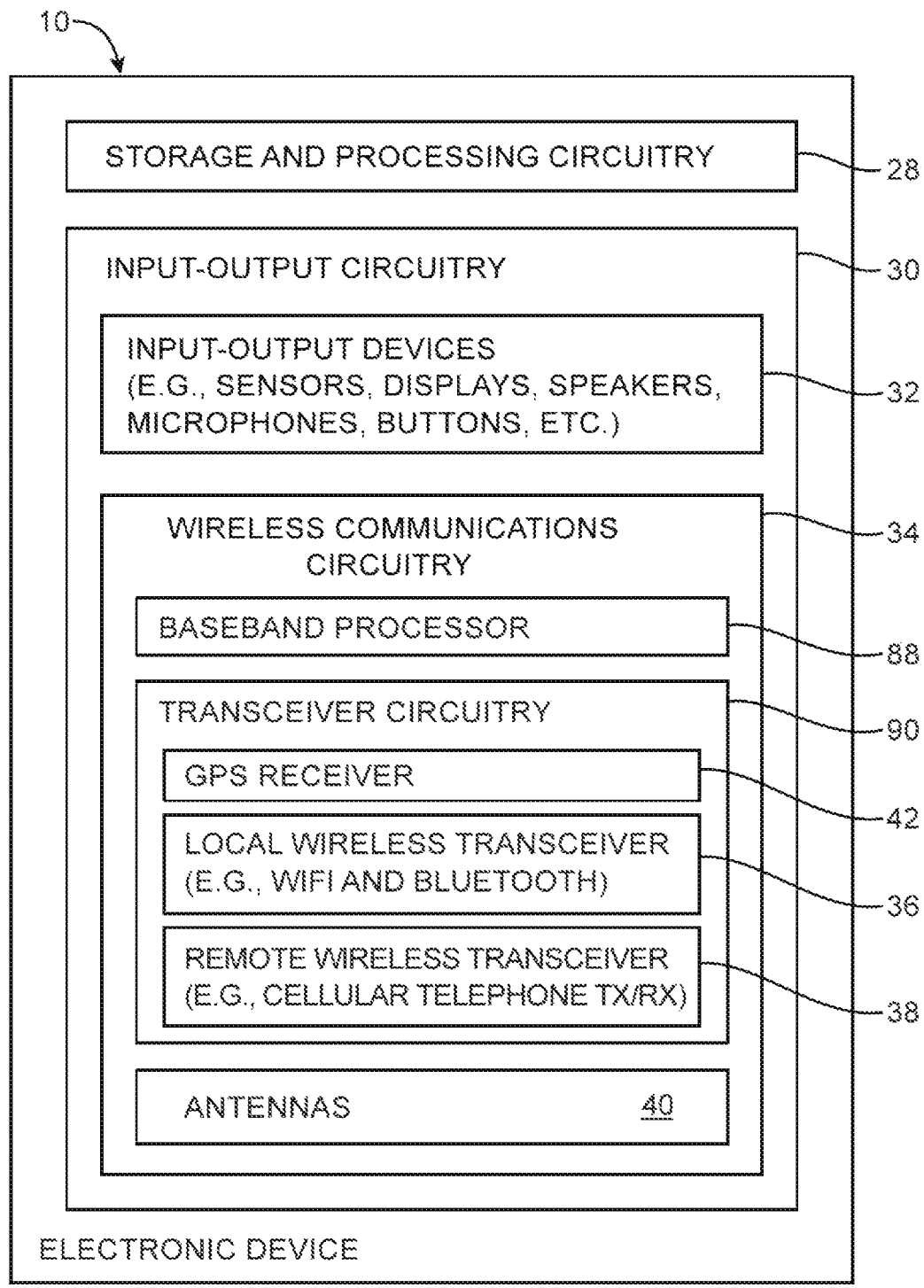
FIG. 1 is a schematic diagram of an illustrative electronic device with wireless communications circuitry in accordance with an embodiment of the present invention.

Electronic devices such as device 10 of FIG. 1 may be provided with wireless communications circuitry. The wireless communications circuitry may be used to support long-range wireless communications such as communications in cellular telephone bands. Examples of long-range (cellular telephone) bands that may be handled by device 10 include the 800 MHz band, the 850 MHz band, the 900 MHz band, the 1800 MHz band, the 1900 MHz band, the 2100 MHz band, the 700 MHz band, and other bands. The long-range bands used by device 10 may include the so-called LTE (Long Term Evolution) bands. The LTE bands are numbered (e.g., 1, 2, 3, etc.) and are sometimes referred to as E-UTRA operating bands. Long-range signals such as signals associated with satellite navigation bands may be received by the wireless communications circuitry of device 10. For example, device 10 may use wireless circuitry to receive signals in the 1575 MHz band associated with Global Positioning System (GPS) communications. Short-range wireless communications may also be supported by the wireless circuitry of device 10. For example, device 10 may include wireless circuitry for handling local area network links such as WiFi® links at 2.4 GHz and 5 GHz, Bluetooth® links at 2.4 GHz, etc.

As shown in FIG. 1, device 10 may include storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, functions related to communications band selection during radio-frequency transmission and reception operations, etc. To support interactions with external equipment (e.g., a radio-frequency base station, radio-frequency test equipment, etc.), storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the "2G" Global System for Mobile Communications (GSM) protocol, the "2G" Code Division Multiple Access (CDMA) protocol, the "3G" Universal Mobile Telecommunications System (UMTS) protocol, the "4G" Long Term Evolution (LTE) protocol, MIMO (multiple input multiple output) protocols, antenna diversity protocols, etc. Wireless communications operations such as communications band selection operations may be controlled using software stored and running on device 10 (i.e., stored and running on storage and processing circuitry 28 and/or input-output circuitry 30).

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens, displays without touch sensor capabilities, buttons, joysticks, click wheels, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 90 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as at 850 MHz, 900 MHz, 1800 MHz, 1900 MHz, and 2100 MHz and/or the LTE bands and other bands (as examples). Circuitry 38 may handle voice data and non-voice data traffic.

Transceiver circuitry 90 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include one or more antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna.

As shown in FIG. 1, wireless communications circuitry 34 may also include baseband processor 88. Baseband processor may include memory and processing circuits and may also be considered to form part of storage and processing circuitry 28 of device 10.

Baseband processor 88 may be used to provide data to storage and processing circuitry 28. Data that is conveyed to circuitry 28 from baseband processor 88 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on reference symbol received power (RSRP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by storage and processing circuitry 28 and/or processor 88 and, in response, storage and processing circuitry 28 (or, if desired, baseband processor 58) may issue control commands for controlling wireless circuitry 34. For example, baseband processor 88 may issue commands that direct transceiver circuitry 90 to switch into use desired transmitters/receivers and antennas.

Antenna diversity schemes may be implemented in which multiple redundant antennas are used in handling communications for a particular band or bands of interest. In an antenna diversity scheme, storage and processing circuitry 28 may select which antenna to use in real time based on signal strength measurements or other data. In multiple-input-multiple-output (MIMO) schemes, multiple antennas may be used in transmitting and receiving multiple data streams, thereby enhancing data throughput.

Figure 2:
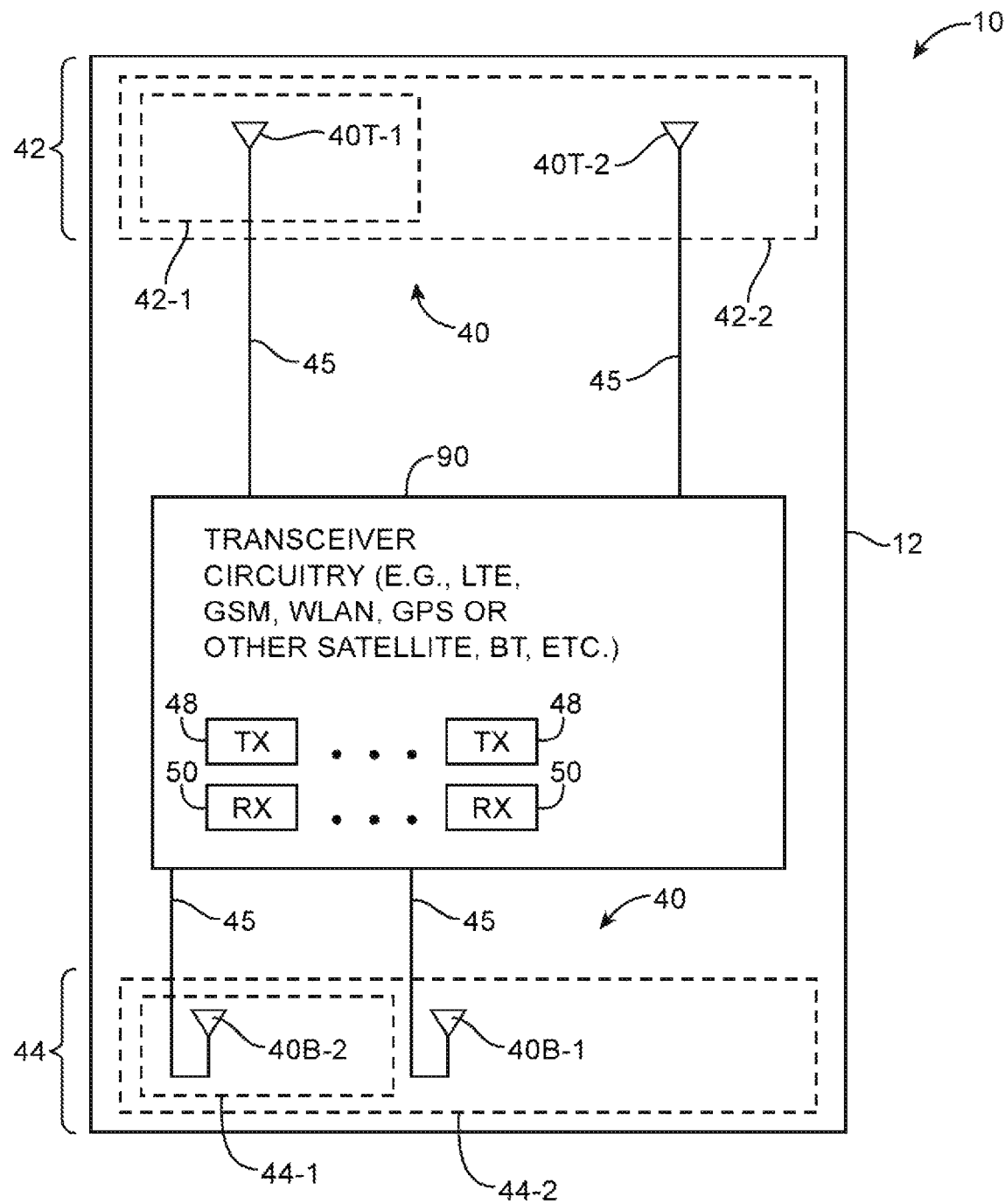
FIG. 2 is a diagram showing how radio-frequency transceiver circuitry may be coupled to antennas within an electronic device of the type shown in FIG. 1 in accordance with an embodiment of the present invention.

Illustrative locations in which antennas 40 may be formed in device 10 are shown in FIG. 2. As shown in FIG. 2, electronic device 10 may have a housing such as housing 12. Housing 12 may include plastic walls, metal housing structures, structures formed from carbon-fiber materials or other composites, glass, ceramics, or other suitable materials. Housing 12 may be formed using a single piece of material (e.g., using a unibody configuration) or may be formed from a frame, housing walls, and other individual parts that are assembled to form a completed housing structure. The components of device 10 that are shown in FIG. 1 may be mounted within housing 12. Antenna structures 40 may be mounted within housing 12 and may, if desired, be formed using parts of housing 12. For example, housing 12 may include metal housing sidewalls, peripheral conductive members such as band-shaped members (with or without dielectric gaps), conductive bezels, and other conductive structures that may be used in forming antenna structures 40.

As shown in FIG. 2, antenna structures 40 may be coupled to transceiver circuitry 90 by paths such as paths 45. Paths 45 may include transmission line structures such as coaxial cables, microstrip transmission lines, stripline transmission lines, etc. Impedance matching circuitry, filter circuitry, and switching circuitry may be interposed in paths 45 (as examples). Impedance matching circuitry may be used to ensure that antennas 40 are efficiently coupled to transceiver circuitry 90 in desired frequency bands of interest. Filter circuitry may be used to implement frequency-based multiplexing circuits such as diplexers, duplexers, and triplexers. Switching circuitry may be used to selectively couple antennas 40 to desired ports of transceiver circuitry 90. For example, a switch may be configured to route one of paths 45 to a given antenna in one operating mode. In another operating mode, the switch may be configured to route a different one of paths 45 to the given antenna. The use of switching circuitry between transceiver circuitry 90 and antennas 40 allows device 10 to switch particular antennas 40 in and out of use depending on the current performance associated with each of the antennas.

In a device such as a cellular telephone that has an elongated rectangular outline, it may be desirable to place antennas 40 at one or both ends of the device. As shown in FIG. 2, for example, some of antennas 40 may be placed in upper end region 42 of housing 12 and some of antennas 40 may be placed in lower end region 44 of housing 12. The antenna structures in device 10 may include a single antenna in region 42, a single antenna in region 44, multiple antennas in region 42, multiple antennas in region 44, or may include one or more antennas located elsewhere in housing 12.

Antenna structures 40 may be formed within some or all of regions such as regions 42 and 44. For example, an antenna such as antenna 40T-1 may be located within region 42-1 or an antenna such as antenna 40T-2 may be formed that fills some or all of region 42-2. Similarly, an antenna such as antenna 40B-1 may fill some or all of region 44-2 or an antenna such as antenna 40B-2 may be formed in region 44-1. These types of arrangements need not be mutually exclusive. For example, region 44 may contain a first antenna such as antenna 40B-1 and a second antenna such as antenna 40B-2.

Transceiver circuitry 90 may contain transmitters such as radio-frequency transmitters 48 and receivers such as radio-frequency receivers 50. Transmitters 48 and receivers 50 may be implemented using one or more integrated circuits (e.g., cellular telephone communications circuits, wireless local area network communications circuits, circuits for Bluetooth® communications, circuits for receiving satellite navigation system signals, power amplifier circuits for increasing transmitted signal power, low noise amplifier circuits for increasing signal power in received signals, other suitable wireless communications circuits, and combinations of these circuits).

Figure 3:
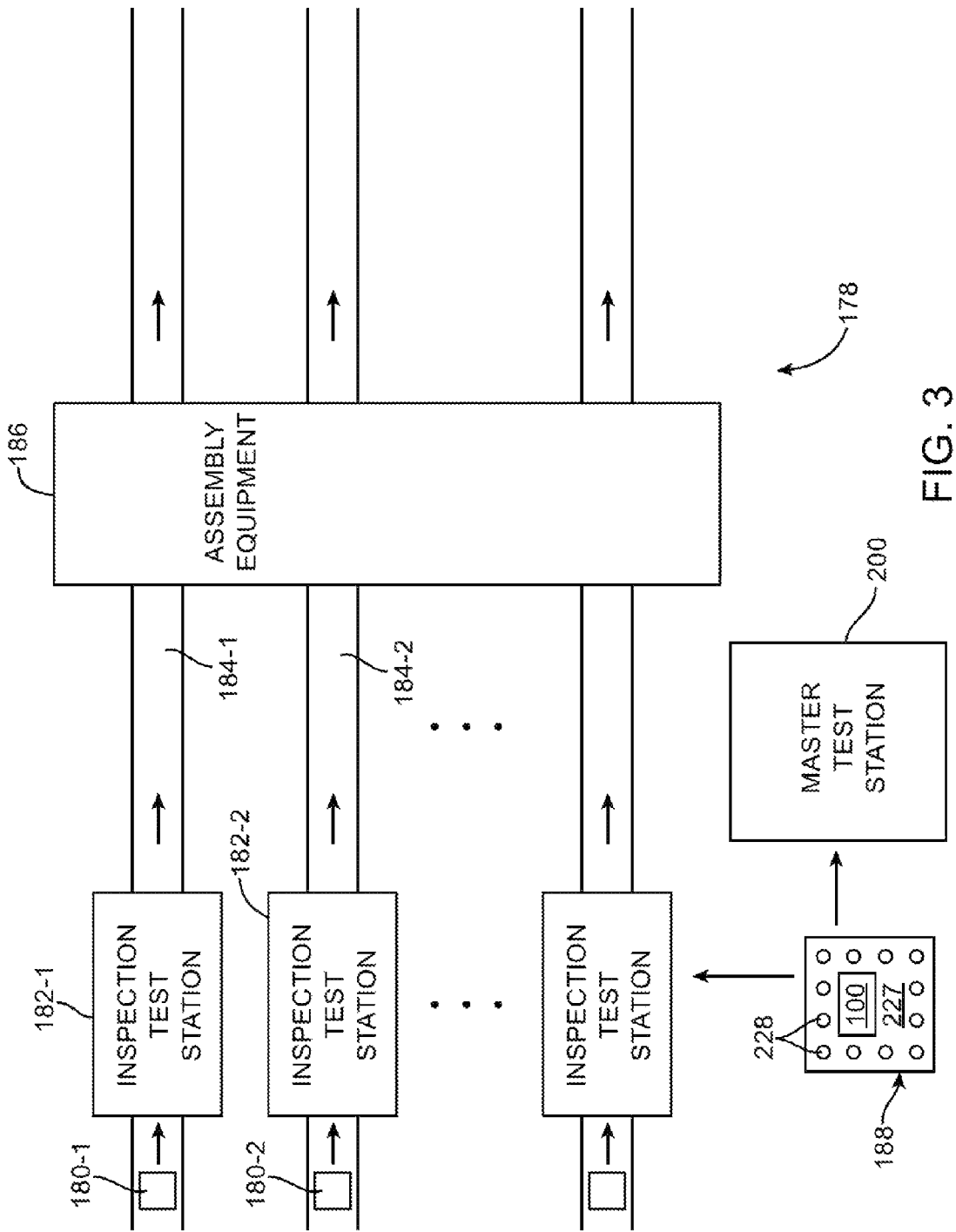
FIG. 3 is diagram of an illustrative assembly line for testing and assembling an electronic device in accordance with an embodiment of the present invention.

In accordance with an embodiment of the present invention, electronic devices 10 may be manufactured using a manufacturing system such as manufacturing system 178 as shown in FIG. 3. Manufacturing system 178 may manufacture a number of electronic devices 10 simultaneously (e.g., many electronic devices 10 may each be assembled on a respective assembly line in parallel). There may be multiple manufacturing systems 178 at a number of different geographical locations for manufacturing electronic devices 10. Manufacturing system 178 may manufacture electronic devices 10 by assembling different components within production devices (e.g., components such as transceiver circuitry 90, antennas 40, wireless communications circuitry 34, etc.). Manufacturing system 178 may also test the performance of components for use in electronic devices 10.

In order to test the performance of many components for use in electronic devices 10 simultaneously, manufacturing system 178 may include a number of assembly lines 184 that each convey a respective component 180 to inspection test stations 182 in parallel (e.g., a first assembly line 184-1 conveys a first component 180-1 to a first inspection test station 182-1, a second assembly line 184-2 conveys a second component 180-2 to a second inspection test station 182-2, etc.). Components 180 that are tested by inspection test stations 182 may sometimes be referred to as components under test.

Inspection test stations 182 may be any suitable test stations for characterizing the performance of components under test 180. For example, inspection test stations 182 may test the radio-frequency performance of components under test 180. Components under test 180 that have sufficient radio-frequency performance may be labeled as "passing" components. Components under test 180 that have insufficient radio-frequency performance may be labeled as "failing" components. Passing components may be conveyed to assembly equipment 186 via assembly lines 184 for further assembly, whereas failing components may be discarded or reworked.

Assembly equipment 186 may further assemble components 180 within a corresponding electronic device 10. Assembly equipment 186 may, for example, modify components 180, attach components 180 to additional components, combine multiple components 180, etc. In the scenario where components 180 are a part of wireless circuitry 34, assembly equipment 186 may attach components 180 to antenna circuitry such as antennas 40 (FIG. 1). Devices 10 with assembled components may be further tested by other test stations, if desired.

During testing of components under test (CUT) 180, each inspection test station 182 may experience measurement variation due to variations between individual inspection test stations 182 (e.g., process, voltage, and temperature variations that may affect the operation of each test station 182). The behavior of each inspection test station 182 is typically unique, because it is challenging to manufacture test stations that are exactly identical to one another. For example, the behavior of inspection test station 182-1 may be different from the behavior of inspection test station 182-2 while performing tests on components under test 180. In addition, it is challenging to limit variation between inspection test stations 182 across multiple manufacturing systems 178 at different locations. Variations between individual inspection test stations 182 make it difficult to provide consistent testing for each component under test 180. It may therefore be desirable to be able to provide a test standard for ensuring that test results are consistent across multiple inspection test stations 182 at different test sites (locations).

A reference standard such as standard 188 (sometimes referred to herein as passive reference test structure, a reference coupon, or a "coupon") may be used to ensure consistent testing across multiple inspection test stations 182. Reference coupon 188 may be provided with similar physical form factor to components under test 180. Reference coupon 188 may include a number of conductive contacts 228 formed on a substrate such as carrier substrate 227. Reference coupon 188 may also include circuitry 100 formed on carrier substrate 227. In addition, reference coupon 188 may include transmission line structures and groups of electrical components formed on carrier substrate 227. Contacts 228 may, for example, be formed from solder bumps on substrate 227 (e.g., bumps sometimes referred to as controlled collapse chip connection (C4) bumps or "flip-chip" bumps). Contacts 228 may allow signals to be passed to and from circuitry 100. Carrier substrate 227 may be a semiconductor substrate, dielectric substrate, or any other suitable substrate for conductive contacts 228 and circuitry 100.

Test stations in manufacturing system 178 may, for example, test a number of radio-frequency parameters associated with components under test 180. If desired, multiple reference coupons such as reference coupon 188 may be provided to test stations in manufacturing system 178. Each reference coupon 188 may be formed to allow radio-frequency testing of a respective subset of the radio-frequency parameters associated with components under test 180 when provided to test stations in manufacturing system 178.

Each manufacturing system 178 may have a "golden" reference test station such as master test station 200. Master test station 200 may be an inspection test station that has been carefully calibrated using a well-known reference standard. Master test station 200 may perform testing operations on reference coupons 188. Reference coupons 188 may be configured as calibration coupons or verification coupons.

Reference coupons 188 that are configured as calibration coupons may serve to provide the well-known reference standard used to calibrate master test station 200. Reference coupons 188 that are configured as calibration coupons may be referred to herein as calibration coupons 226 (see, e.g., calibration coupon 226 of FIG. 5). Calibration coupons 226 may be formed with transmission lines structures and/or groups of electrical components that are coupled to a number of conductive contacts 228. Calibration coupons 226 may have predetermined radio-frequency performance characteristics. During calibration of master test station 200, master test station 200 may measure radio-frequency performance characteristics associated with calibration coupons 226 (e.g., radio-frequency performance characteristics associated with the transmission line structures, groups of electrical components, contacts 228, and substrate 227). The measured performance characteristics of calibration coupons 226 may be compared to the predetermined performance characteristics to suitably calibrate master test station 200.

Reference coupons 188 that are configured as verification coupons may be provided to master test station 200 after calibration. Reference coupons 188 that are configured as verification coupons may be referred to herein as verification coupons 326 (see, e.g., verification coupon 326 of FIG. 10). Verification coupons 326 may include circuitry 100 that is formed to model the electrical behavior (e.g., impedance characteristics) of components under test 180. Verification coupons 326 may be measured by master test station 200 to establish baseline test measurements. Verification coupons 326 may be subsequently measured by inspection test stations 182. The measurements performed by inspection test stations 182 may be compared to the baseline test measurements to characterize the performance of individual inspection test stations 182. Characterizing the performance of individual inspection test stations 182 in this way serves to ensure consistent behavior across all inspection test stations 182.

Figure 4:
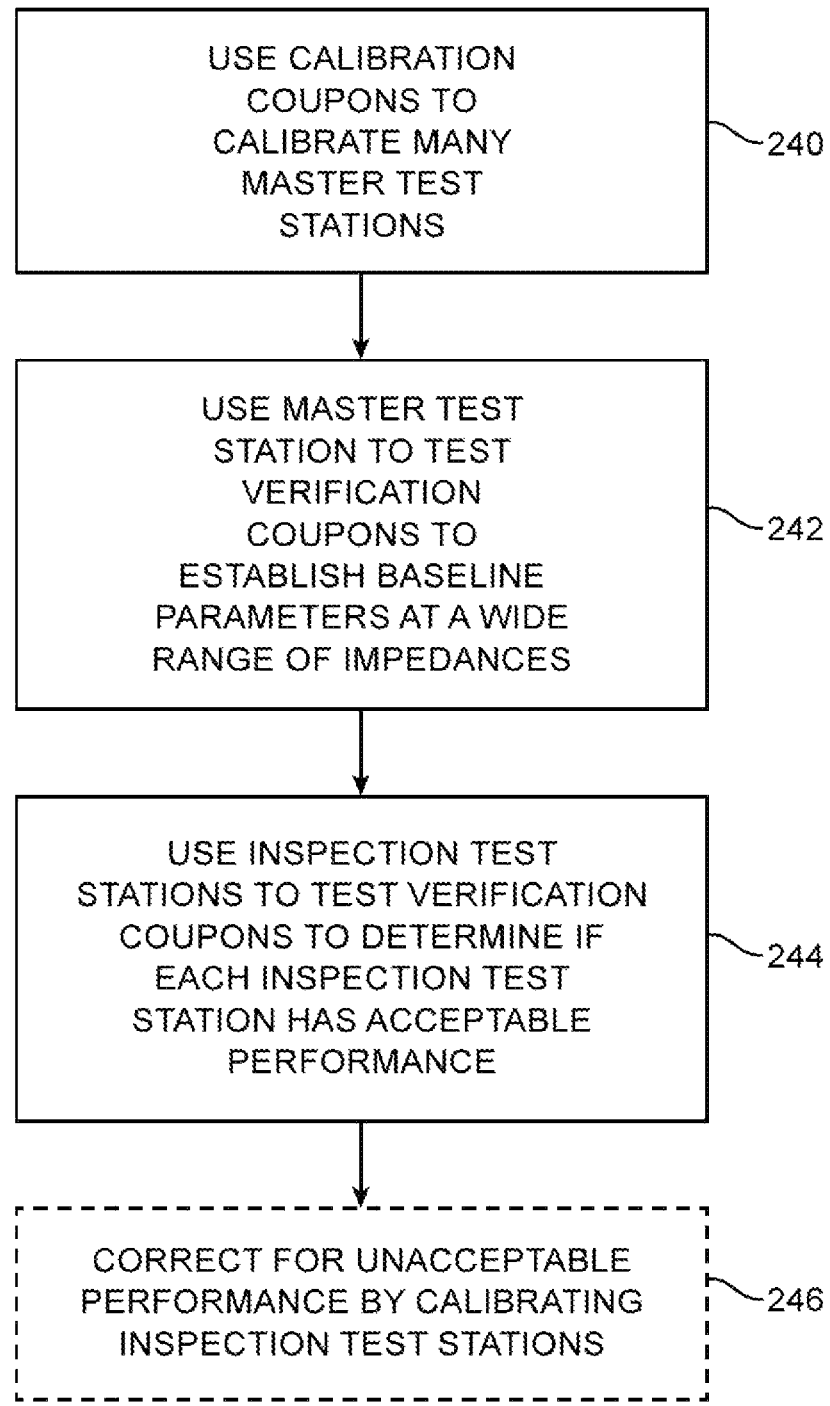
FIG. 4 is a flow chart of illustrative steps for testing the performance of inspection test stations using calibration and verification coupons in accordance with an embodiment of the present invention.

A flow chart of illustrative steps that may be performed by a manufacturing system such as manufacturing system 178 to test the performance of inspection test stations 182 is shown in FIG. 4.

At step 240, one or more calibration coupons 226 having well-known radio-frequency performance characteristics are provided to master test station 200. The radio-frequency performance characteristics of the calibration coupons 226 may be determined through simulation, modeling, or any other suitable method for characterizing calibration coupons 226. Calibration coupons 226 may also be provided to other master test stations 200 at other locations for master test station calibration. Master test stations 200 may perform measurements on calibration coupons 226 to obtain calibration measurement data. The calibration measurement data may be compared with the known measurement characteristics of calibration coupons 226 to calibrate master test stations 200. In this way, master test stations 200 at many different locations may be calibrated using the same reference standard.

At step 242, one or more verification coupons 326 are provided to master test station 200. Circuitry 100 in verification coupons 326 may have electrical characteristics such as impedance values that are similar to impedance values of components under test 180. Master test station 200 may perform measurements on verification coupons 326 to obtain baseline test measurement data. A number of verification coupons 326 having different impedance values may be measured by master test station 200 (e.g., circuitry 100 on verification coupons 326 may be formed having different impedance values). In this way, master test stations 200 may obtain baseline measurement data for verification coupons 326 with circuitry having a wide range of impedance values. This process may occur across multiple manufacturing systems 178 at different locations in parallel.

At step 244, verification coupons 326 that are measured by master test station 200 may be supplied to an inspection test station such as inspection test station 182-(FIG. 3). Inspection test station 182-1 may perform the same measurements on verification coupons 326 that are performed by master test stations 200 in order to obtain test station measurement data associated with inspection test station 182-1. The test station measurement data may be compared to the baseline test measurement data to validate the performance of inspection test station 182-1. For example, if the test station measurement data varies significantly from the baseline test measurement data, test station 182-1 may be characterized as having unacceptable performance. Test stations 182 that are characterized as having unacceptable performance may be labeled "failing" test stations. If the test station measurement data sufficiently matches the baseline test measurement data, test station 182-1 may be characterized as having acceptable performance. Test stations 182 that are characterized as having acceptable performance may be labeled "passing" test stations. This process may be repeated at all inspection test stations 182. The performance of inspection test stations 182 may be consistently tested across different manufacturing systems 178 at different locations because each manufacturing system 178 is calibrated using the same calibration coupons 226 (i.e., the same reference standards are used to calibrate master test stations at each manufacturing system 178).

At step 246, failing inspection test stations 182 may optionally generate calibration data to correct for unacceptable performance. For example, the calibration data may be used to obtain offset settings that compensate for the test measurement data obtained by failing inspection test stations 182 to help sufficiently match the baseline measurement data.

In accordance with an embodiment of the present invention, master test station 200 may be calibrated using a reference standard such as calibration coupon 226. Calibration coupon 226 may include a number of transmission lines structures (e.g., microstrip transmission lines, stripline transmission lines, etc.) and resistive loads coupled between one or more conductive contacts 228. A number of calibration coupons 226 may be formed each having different respective transmission lines structures and groups of electrical components (e.g., resistive loads). The selected transmission lines structures and groups of electrical components in calibration coupon 226 may be chosen to allow master test station 200 to calibrate systematic errors associated with conductive contacts 228, various transmission line structures, and groups of electrical components on carrier substrate 227. Calibration coupon 226 may be formed to replicate the physical form factor of components under test 180. In general, using calibration coupon 226 having physical dimensions similar to those of components under test 180 can help improve calibration accuracy.

Figure 5:
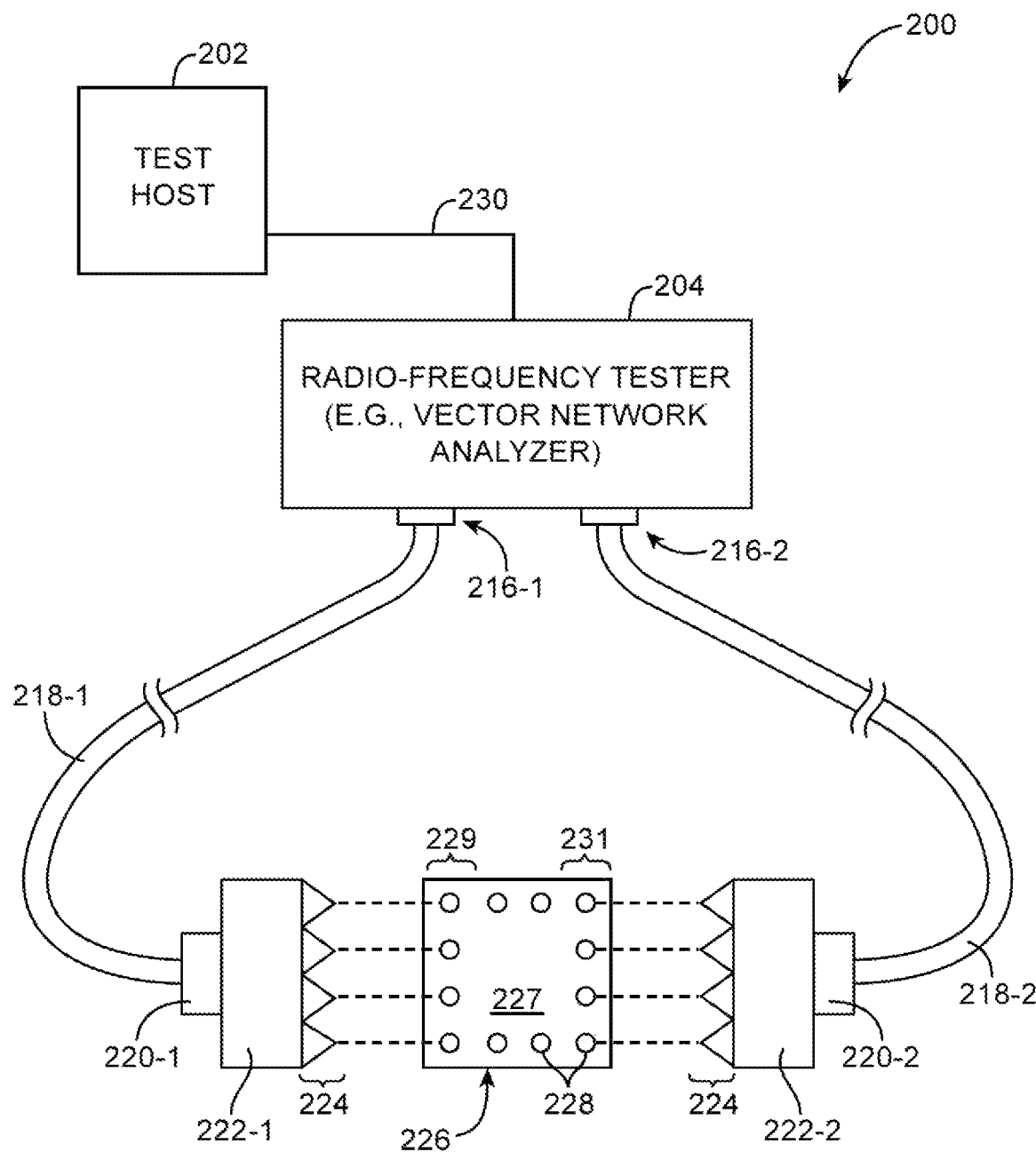
FIG. 5 is a diagram of an illustrative master test station that is calibrated using a calibration coupon in accordance with an embodiment of the present invention.

As shown in FIG. 5, master test station 200 may include a test host such as test host 202 (e.g., a personal computer, laptop computer, tablet computer, etc.), a radio-frequency tester such as radio-frequency tester 204, control circuitry, network circuitry, cabling, and other test equipment.

Radio-frequency tester 204 may be, for example, a vector network analyzer. Tester 204 may have a first port 216-1 to which a first radio-frequency cable 218-1 is connected and a second port 216-2 to which a second radio-frequency cable 216-2 is connected. Radio-frequency cables 218-1 and 218-2 may be, for example, coaxial cables. In particular, first cable 218-1 may have a first end that is connected to tester port 216-1 and a second end terminating at a first radio-frequency connector 220-1. Similarly, second cable 218-2 may have a first end that is connected to tester port 216-2 and a second end terminating at a second radio-frequency connector 220-2. Radio-frequency connectors 220-1 and 220-2 may be, for example, SubMiniature Version A (SMA) connectors or any other suitable radio-frequency connectors. First radio-frequency connector 220-1 may be coupled to radio-frequency test probe 222-1. Similarly, second radio-frequency connector 220-2 may be coupled to radio-frequency test probe 222-2. Radio-frequency test probes 222-1 and 222-2 may have probe contacts 224 (sometimes referred to as conductive probe tips or probe pins).

During calibration, first port 216-1 of tester 204 may be coupled to a first group 229 of conductive contacts 228 on calibration coupon 226 (e.g., by touching probe contacts 224 of test probe 222-1 to first group 229 of conductive contacts 228), whereas second port 216-2 of tester 204 may be coupled to a second group 231 of conductive contacts 228 (e.g., by touching probe contacts 224 of test probe 222-2 to second group 231 of contacts 228). Radio-frequency tester 204 may receive commands from test host 202 via path 230 that direct tester 204 to gather desired radio-frequency measurements from calibration coupon 226. If desired, test data can be provided from tester 204 to test host 202 via path 230.

Radio-frequency tester 204 may be configured to produce radio-frequency test signals that are applied to coupon 226 via cables 218 and probes 222. Tester 204 may apply radio-frequency test signals to one or more probe contacts 224. Tester 204 may also provide a path to ground to one or more probe contacts 224. Calibration coupon 226 may emit radio-frequency signals when being energized by the test signals generated using tester 204. As electromagnetic test signals are transmitted by tester 204 and applied to calibration coupon 226 through test cable 218-1, corresponding emitted electromagnetic signals may be received through test cable 218-2 (as an example). Tester 204 may also receive reflected signals via cable 218-1 (i.e., signals that were reflected from calibration coupon 226 in response to the signals transmitted through test cable 218-1).

The reflected signals gathered in this way may be used to compute a reflection coefficient (sometimes referred to as an S11 parameter or S11 scattering parameter). The transmitted signals on cable 218-1 and corresponding received signals on cable 218-2 may be used to compute a forward transfer coefficient (sometimes referred to as an S21 parameter or S21 scattering parameter). The S11 and S21 data may include magnitude and phase components.

Similarly, tester 204 may also transmit test signals to calibration coupon 226 through test cable 218-2. As test electromagnetic signals are transmitted by tester 204 and applied to calibration coupon 226 through test cable 218-2, corresponding emitted electromagnetic test signals may be received through test cable 218-1. Tester 204 may also receive reflected signals via cable 218-2 (i.e., signals that were reflected from calibration coupon 226 in response to the signals transmitted through test cable 218-2). The emitted and reflected signals gathered in this way may be used to compute reflection coefficient data (sometimes referred to as an S22 scattering parameter) and forward transfer coefficient data (sometimes referred to as an S12 scattering parameter) and forward transfer coefficient data (sometimes referred to as an S12 scattering parameter).

The S11, S12, S22, and S21 parameters (collectively referred to as scattering parameters or S parameters) measured using tester 204 may collectively be used as measurement data that is representative of the radio-frequency performance characteristics of master test station 200. Calibration coupon 226 may have well-known, predetermined radio-frequency characteristics such as predetermined S parameters. The predetermined radio-frequency characteristics of calibration coupon 226 may be determined, for example, through detailed simulation and modeling of calibration coupon 226. Calibration coupon 226 may be precisely manufactured (e.g., by laser-trimming) to exhibit the predetermined radio-frequency characteristics associated with calibration coupon 226.

The predetermined characteristics of calibration coupon 226 may establish a baseline reference (e.g., baseline S parameters) for calibrating master test station 200. Assuming that systematic errors associated with master test station 200 (including errors associated with tester 204, ports 216, cables 218, radio-frequency connectors 220, test probes 222, and probe contacts 224) have been calibrated, the measurement data may be compared to the baseline reference obtained by master test station 200 during calibration operations to calibrate master test station 200. For example, offset settings may be generated for master test station 200 during calibration operations. The offset settings may be provided to tester 204 to enable the measurement data obtained by master test station 200 to suitably match the baseline reference. Calibrating master test station 200 in this way may calibrate systematic errors associated with contacts 228 and carrier substrate 227 of calibration coupon 226.

Master test station 200 as shown in FIG. 5 is merely illustrative and does not serve to limit the scope of the present invention. If desired, master test station 200 may include other means of controlling and monitoring the operation of tester 204, may include other types of radio-frequency testers for measuring the characteristics of coupon 226, and may include other suitable test equipment. Calibration coupon 226 may include any number of conductive contacts 228 and test probes 222 may include any suitable number of corresponding probe contacts 224.

A number of different calibration coupons 226 each formed with different transmission lines structures and groups of electrical components may be sequentially measured by master test station 200. Transmission line structures in calibration coupon 226 may have associated properties that affect the impedance of the transmission line structures (e.g., transmission line widths, transmission line lengths, etc.). The radio-frequency characteristics of the transmission line structures may be selected (e.g., by forming transmission lines structures with suitable dimensions) to allow master test station 200 to calibrate systematic errors associated with conductive contacts 228 and carrier substrate 227.

FIG. 6A-6D are diagrams of calibration coupons 226 having different transmission lines structures (e.g., calibration coupon 226 may have a first configuration of transmission line structures shown by calibration coupon 226-1 of FIG. 6A, calibration coupon 226 may have a second configuration shown by calibration coupon 226-2 of FIG. 6B, etc.).

In one suitable embodiment of the present invention, calibration coupon 226-1 may include a transmission line 232 that forms an electrical short between a number of signal contacts 228-1 as shown in FIG. 6A. In the example of FIG. 6A, calibration coupon 226-1 has a transmission line short 232 formed between conductive signal contacts 228-1 and ground contacts 228-2. Transmission line short 232 may be formed having a selected width W to provide short 232 with suitable impedance. During calibration of master test station 200, first group 229 of contacts 228 are coupled to test probe 222-1 and second group 231 of contacts 228 are coupled to test probe 222-2 via probe contacts 224 (see FIG. 5). Tester 204 may provide radio-frequency test signals at signal contacts 228-1 and a path to ground at ground contacts 228-2. Transmission line short 232 may thereby provide an electrical short to ground for radio-frequency test signals provided at signal contacts 228-1 from tester 204.

In another suitable arrangement of the present invention, calibration coupon 226-2 may be formed in an open circuit configuration as shown in FIG. 6B (e.g., none of contacts 228 are connected via transmission line structures). During calibration of master test station 200, first group 229 of contacts 228 are coupled to test probe 222-1 and second group 231 of contacts 228 are coupled to test probe 222-2 via probe contacts 224. In such an arrangement, probes 222 are provided with an open circuit.

In another suitable arrangement of the present invention, calibration coupon 226-3 may include an electrical component such as a resistive load as shown in FIG. 6C. In such an arrangement, resistive structures such as resistors 236 may be coupled to signal contacts 228-1 via transmission lines 234. Transmission lines 234 may be formed having a selected length L and a selected width W to provide transmission lines 234 with suitable impedance. Resistors 236 may be interposed between transmission lines 234 and ground 237. Ground 237 may be formed in a lower layer within carrier substrate 227 (e.g., ground 237 may be formed as conductive ground plane within carrier substrate 227). During calibration operations, tester 204 may provide radio-frequency test signals at signal contacts 228-1 via test probes 222 that are conveyed to ground 237 via transmission lines 234 and resistors 236.

In yet another suitable arrangement, calibration coupon 226-4 may include a through path between a number of signal contacts 228-1 as shown in FIG. 6D. In the example of FIG. 6D, coupon 226-4 is formed with transmission line 240 that serves as an electrical through path between two signal contacts 228-1. Transmission line 240 may be formed having a selected width W to provide transmission line path 240 with suitable impedance. During calibration operations, tester 204 may provide radio-frequency test signals at signal contacts 228-1. Transmission line 240 provides a through path for the test signals provided at signal contacts 228-1.

Figure 6:
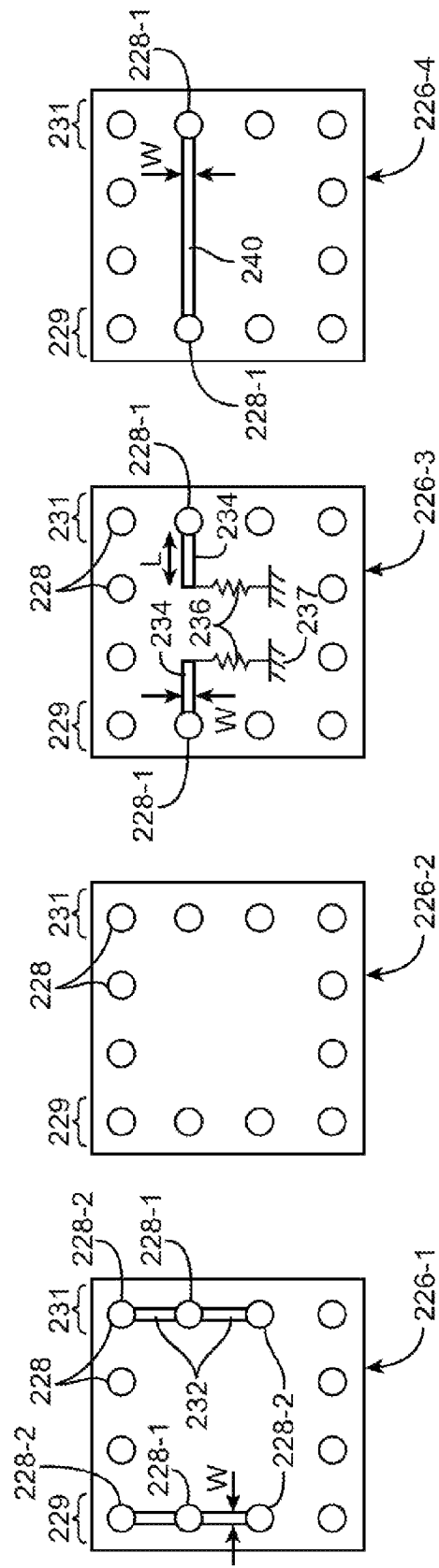
FIGS. 6A-6D are diagrams of calibration coupons that may be formed with different transmission line structures for calibrating a master test station in accordance with an embodiment of the present invention.

Calibration coupons 226 of FIG. 6 are merely illustrative. If desired, calibration coupons 226 may be configured with any suitable transmission line structures and groups of electrical components between any number of contacts 228 (e.g., between any number of signal contacts 228-1 and ground contacts 228-2). The transmission line structures shown in FIG. 6 may be suitably combined or altered to affect the radio-frequency performance characteristics of calibration coupon 226.

Master test station 200 may measure radio-frequency characteristics of calibration coupon 226 such as S parameters for each of the calibration coupon configurations shown in FIG. 6 (e.g., for calibration coupons 226-1, 226-2, etc.). The measured S parameters for each configuration of calibration coupon 226 may be compared to baseline S parameters to provide calibration data for master test station 200. The baseline S parameters may be determined by detailed simulation and modeling of each configuration of calibration coupon 226. Alternatively, the baseline S parameters may be determined by comparing the measured S parameters for many master test stations such as master test station 200 at different locations (e.g., for master test stations 200 in manufacturing systems 178 formed at different geographical locations). Assuming systematic errors associated with master test station 200 have been removed, the measured S parameters may be compared to the baseline S parameters to calibrate systematic errors associated with contacts 228 and carrier substrate 227.

Figure 7:
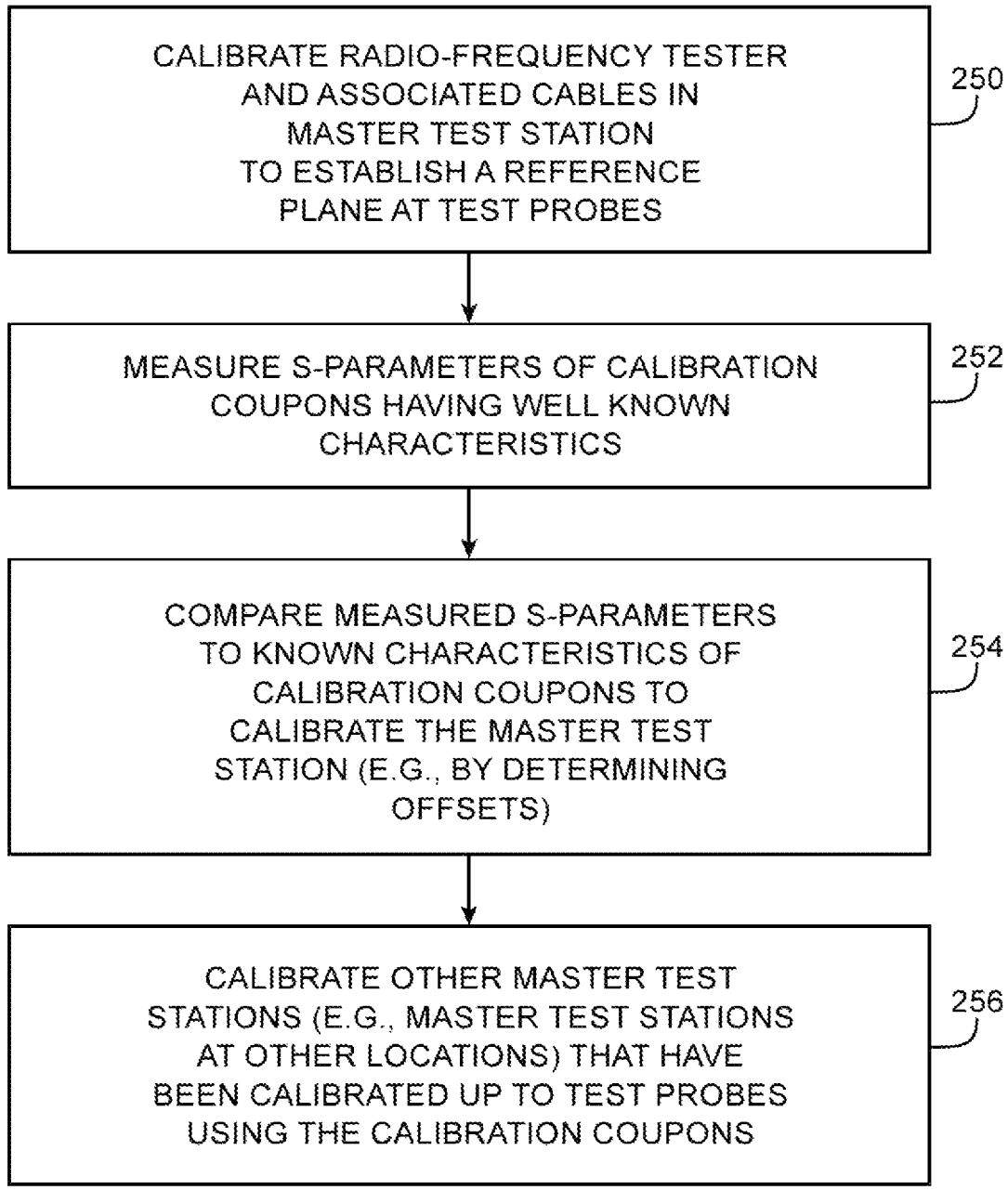
FIG. 7 is a flow chart of illustrative steps for calibrating a master test station using calibration coupons having predetermined radio-frequency performance characteristics in accordance with an embodiment of the present invention.

A flow chart of illustrative steps for calibrating master test station 200 is shown in FIG. 7. In calibrating master test station 200, it may be desirable to separate the effects associated with the transmission medium (e.g., the effects associated with test cables 218, test probe 222, and probe contacts 224) from circuitry formed internal to conductive contacts 228 (e.g., circuitry that receives signals from probes 222 via conductive contacts 228). At radio-frequencies, systematic effects such as signal leakage and impedance mismatch can affect measured data. In a stable calibration environment, such types of systematic effects are repeatable and can be characterized and removed via calibration. As an example, calibration coupons 226 can be connected to tester 204 during calibration. Systematic effects may then be quantified by computing the difference between measured and known responses associated with calibration coupon 226. This process of removing systematic effects associated with master test station 200 is sometimes referred to as error correction.

Figure 9:
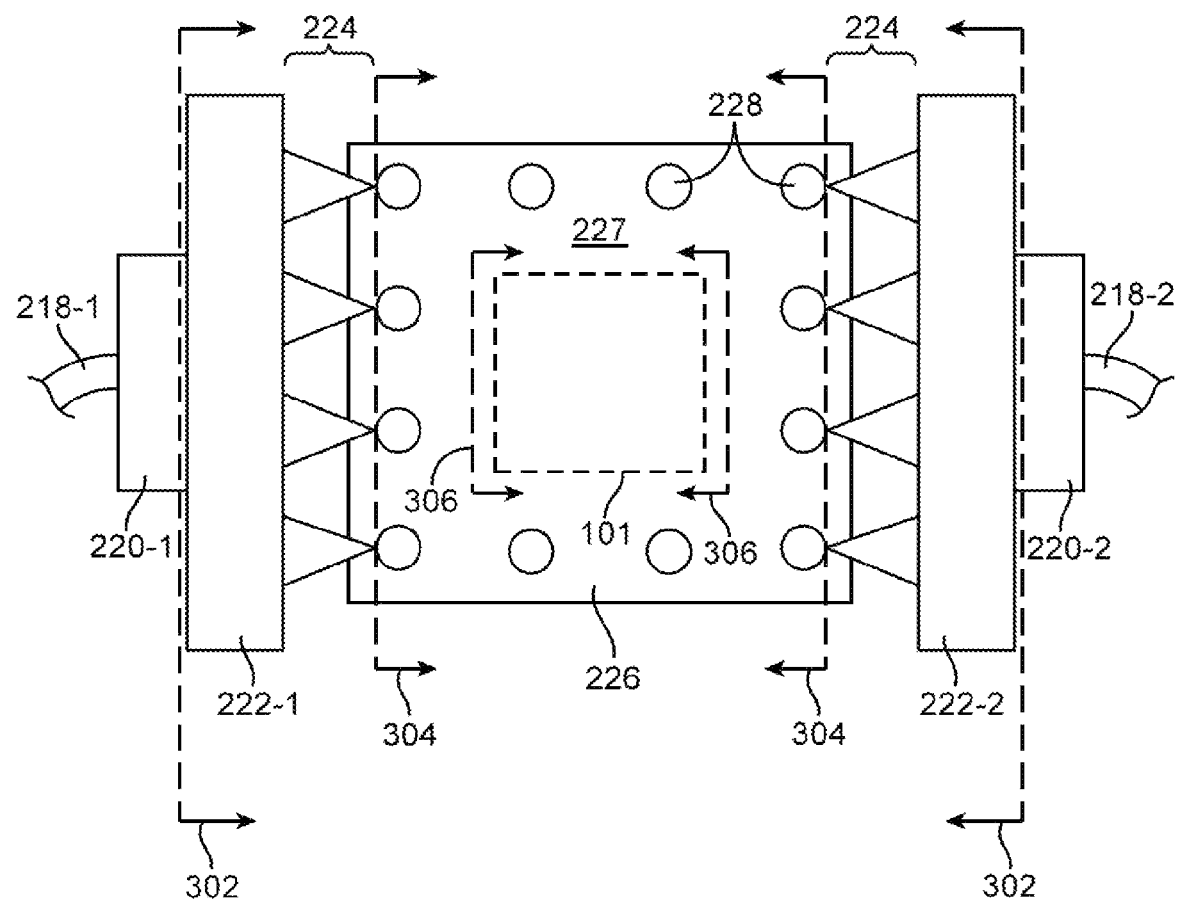
FIG. 9 is a diagram showing how test reference planes may be shifted using the steps of FIGS. 7 and 8 in accordance with an embodiment of the present invention.

At step 250, radio-frequency tester 204 may be calibrated to remove potential errors that are associated with radio-frequency tester 204 and coaxial cables 218 (i.e., cables 218-1 and 218-2). For example, vector network analyzer 204 may be calibrated at the coaxial ports using known coaxial standards (e.g., using conventional open, short, load, and thru coaxial standards) to ensure that vector network analyzer 204 is initialized to desired test settings. Once this step is complete, measurements gathered using tester 204 will only reflect the behavior of structures coupled to the ends of coaxial cables 218 (e.g., ports 216-1 and 216-2 of tester 204 are virtually extended to the ends of cables 218 so that a new reference plane 302 is established, as shown in FIG. 9.

Test probes 222 (i.e., test probes 222-1 and 222-2) and probe contacts 224 may also be calibrated to de-embed systematic effects that are associated with test probes 222 and probe contacts 224. For example, probes 222 and probe contacts 224 may be calibrated at probe contacts 224 using known probe standards (e.g., using conventional open, short, load, and thru probe standards). Once this step is complete, measurements gathered using tester 204 will only reflect the behavior of structures coupled to probe contacts 224 (e.g., ports 216-1 and 216-2 of tester 204 are virtually extended to the ends of probe contacts 224 so that a new reference plane 304 is established).

At step 252, a number of calibration coupons 226 each having different transmission line structures and groups of electrical components may be coupled to master test station 200 (e.g., calibration coupons such as 226-1, 226-2, 226-3, and 226-4 of FIGS. 6A-6D may be coupled to master test station 200). During calibration, conductive contacts 228 of each calibration coupon 226 are coupled to probe contacts 224. Master test station 200 may measure radio-frequency characteristics such as S parameters for calibration coupons 226 having each transmission line configuration.

In one suitable arrangement, calibration coupons 226 having the configurations shown in FIGS. 6A-6D (e.g., calibration coupons 226-1, 226-2, etc.) may be measured to calibrate master test station 200 using a THRU-REFLECT-LINE (TRL) approach. The TRL approach is a two-port calibration procedure that relies on testing different transmission line structures on a substrate such as substrate 227 to fully characterize the systematic errors associated with substrate 227 and contacts 228.

For example, a reference standard such as calibration coupon 226 having different types of transmission line structures (e.g., calibration coupons 226-1, 226-2, 226-3, and 226-3 of FIGS. 6A-6D) may be coupled to radio-frequency tester 204 during step 252. In this example, the TRL approach involves sequentially coupling tester 204 to contacts 228 on each of calibration coupons 226-1, 226-2, 226-3, and 226-4.

During the THRU calibration step, calibration coupon 226-4 of FIG. 6 may be coupled to tester 204 while obtaining desired two-port measurements (i.e., first group 229 and second group 231 of contacts 228 on calibration coupon 226-4 may be coupled to probe contacts 224 of test probes 222). During a first half of the REFLECT calibration step, tester 204 may be coupled to calibration coupon 226-2 while obtaining a first set of reflection coefficient measurements associated with an open circuit response (i.e., first group 229 and second group 231 of contacts 228 on calibration coupon 226-2 may be coupled to probe contacts 224 of test probes 222). During a second half of the REFLECT calibration step, tester 204 may be coupled to calibration coupon 226-3 while obtaining a second set of reflection coefficient measurements associated with a resistive load circuit response (i.e., first group 229 and second group 231 of contacts 228 on calibration coupon 226-3 may be coupled to probe contacts 224 of test probes 222). During the LINE calibration step, tester 204 may be coupled to calibration coupon 226-4 formed with transmission line 240 between signal contacts 228-1 while obtaining a set of two-port measurements (i.e., first group 229 and second group 231 of contacts 228 on calibration coupon 226-4 may be coupled to probe contacts 224 of test probes 222).

Measurements gathered from calibration coupons 226 can then be applied to tester 204 to remove any effects associated with carrier substrate 227 and contacts 228. Once the TRL calibration is complete, measurements performed by tester 204 on any additional reference standards 188 such as verification coupons 326 having circuitry 100 will only reflect the behavior of internal circuitry 100 (e.g., ports 216-1 and 216-2 of tester 204 will be virtually extended to the edge of circuitry 100, shifting the test reference plane to position 306 as shown in FIG. 9). If desired, any suitable variation of the TRL approach can be used during step 252.

At step 254, the S parameters measured by master test station 200 may be compared to known characteristics (e.g., to well-known, predetermined baseline S parameters) of calibration coupons 226 to calibrate master test station 200. Once master test station 200 has been calibrated, any subsequent measurements gathered using tester 204 from additional reference standards 188 such as verification coupons 326 will only reflect the behavior of internal circuitry 100 (e.g., ports 216-1 and 216-2 of tester 204 will be virtually extended to the edge of circuitry 100, shifting the test reference plane to position 306). At this point, all errors associated with master test station 200, contacts 228, and carrier substrate 227 have been calibrated for.

At step 256, calibration coupons 226 may be passed to master test stations 200 at other locations. For example, coupons 226 may be passed to master test stations 200 in manufacturing systems 178 formed at other geographic locations. Master test stations 200 in manufacturing systems 178 formed at other locations may be similarly calibrated with calibration coupons 226 using the steps of FIG. 7.

Figure 8:
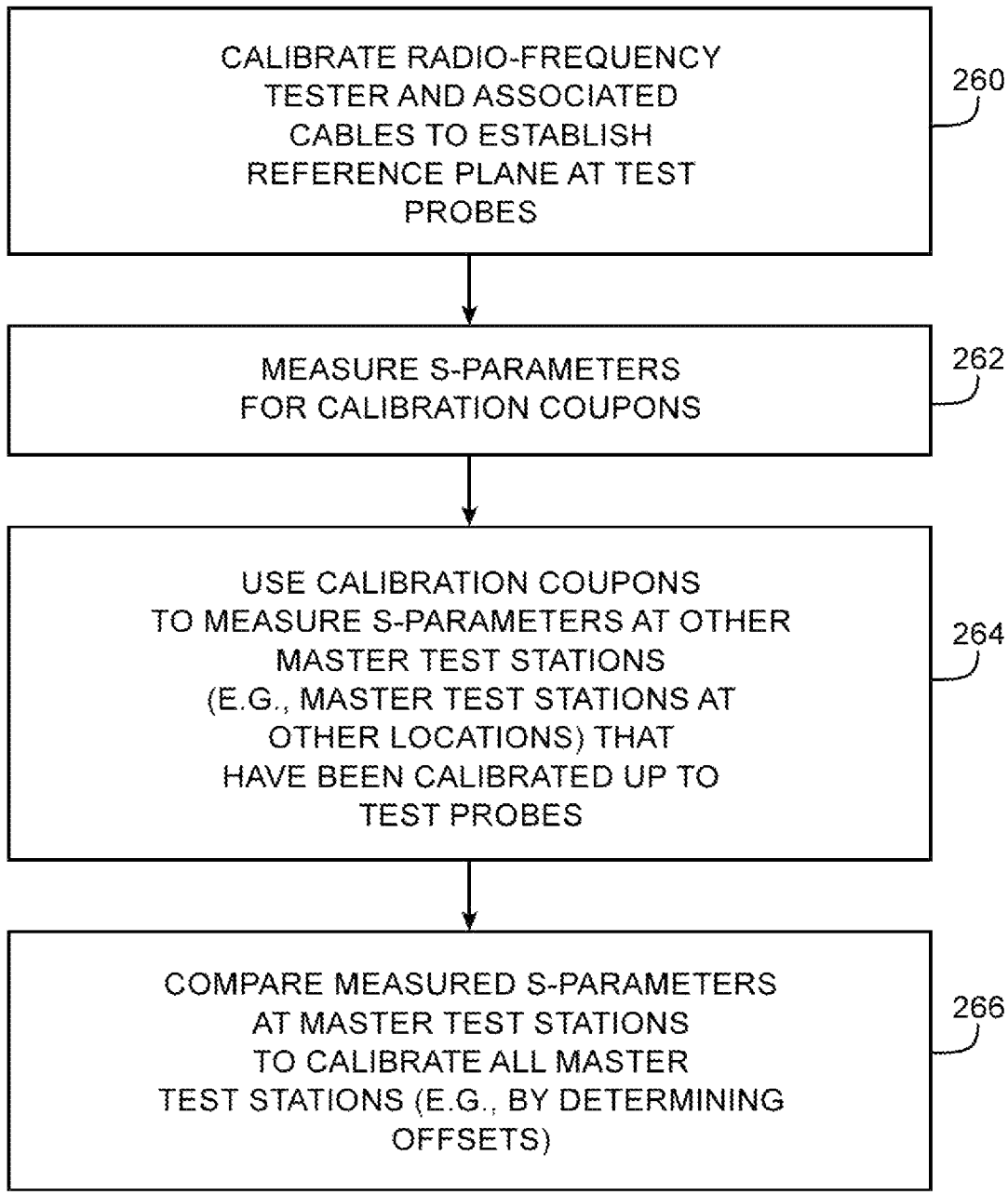
FIG. 8 is a flow chart of illustrative steps for calibrating a master test station using calibration coupons by comparing calibration measurements at multiple master test stations in accordance with an embodiment of the present invention.

A flow chart of illustrative steps for calibrating master test station 200 in another suitable embodiment of the present invention is shown in FIG. 8.

At step 260, master test station 200 may be calibrated using step 250 of FIG. 7. Once this step is complete, measurements gathered using tester 204 will only reflect the behavior of structures coupled to probe contacts 224 (e.g., ports 216-1 and 216-2 of tester 204 are virtually extended to the ends of probe contacts 224 so that a new reference plane 304 is established, as shown in FIG. 9).

At step 262, master test station 200 may measure S parameters of a number of calibration coupons 226 each having different transmission line configurations (e.g., calibration coupons 226-1, 226-2, 226-3, and 226-4 of FIG. 6) using step 252 of FIG. 7. The calibration coupons 226 measured at step 262 may not have well-known predetermined S parameters.

At step 264, calibration coupons 226 may be passed to master test stations 200 at other locations (e.g., master test stations 200 in manufacturing systems 178 formed at other geographic locations). Master test stations 200 at other locations may perform step 262 to measure the S parameters of calibration coupons 226 having each transmission line configuration.

At step 266, the measured S parameters for each master test station 200 used to measure calibration coupons 266 are compared to one another to establish baseline S parameters. For example, the baseline S parameters may be established by averaging the S parameters measured at all master test stations 200 or by any other suitable algorithm that operates on the S parameters measured at a number of master test stations 200. The S parameters measured at each master test station 200 may be compared to the baseline S parameters to calibrate each master test station 200 up to reference plane 306 as shown in FIG. 9.

Once master test station 200 has been calibrated up to reference plane 306, any further reference coupons 188 that are measured by master test station 200 such as verification coupons 326 may thereby be calibrated up to reference plane 306 (e.g., the effects of all errors associated with master contacts 228 and carrier substrate 227 have been calibrated for). After calibration, master test station 200 may measure verification coupons 326 to establish a baseline test reference with which to characterize the performance of inspection test stations 182 (see FIG. 3).

Master test station 200 may measure radio-frequency characteristics such as S parameters of verification coupons 326 to establish the baseline test reference (e.g., baseline S parameters). Verification coupons 326 may be passed to inspection test stations 182 to test the radio-frequency performance of inspection test stations 182.

Figure 10:
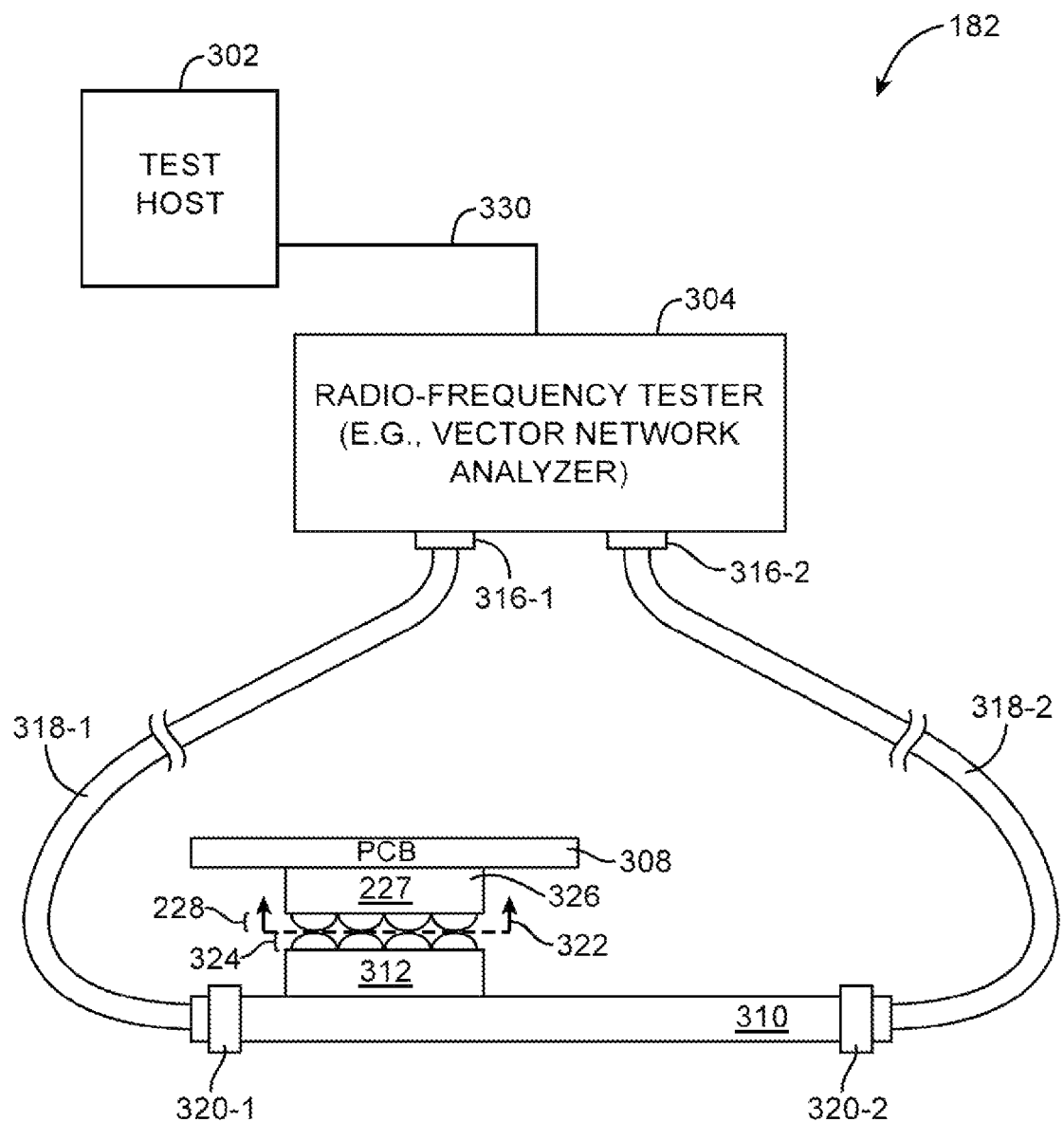
FIG. 10 is a diagram of an illustrative inspection test station that is tested using a verification coupon mounted to a coupon support structure in accordance with an embodiment of the present invention.

In accordance with an embodiment of the present invention, the performance of inspection test stations such as inspection test station 182 may be tested using a test standard such as verification coupon 326 as shown in FIG. 10. Conductive contacts 228 and carrier substrate 227 of verification coupons 326 may be described by the same systematic errors associated with calibration coupons 226.

As shown in FIG. 10, inspection test station 182 may include a test host such as test host 302 (e.g., a personal computer, laptop computer, tablet computer, etc.), a radio-frequency tester such as radio-frequency tester 304, test structures such as test fixture 310 and probing structure 312, control circuitry, network equipment, cabling, and other test equipment. Verification coupon 326 may be mounted on a support structure such as coupon support structure 308 (e.g., a printed circuit board) during testing. Support structure 308 may secure verification coupon 326 in a known fixed position during test operations.

Probing structure 312 may be supported by test fixture 310. Test fixture 310 may be a plastic support structure or other dielectric substrate, a rigid printed circuit board substrate, or other substrate material. Probing structure 312 may, for example, be constructed using a flexible printed circuit ("flex circuit") formed from a sheet of polyimide or other flexible polymer, or other substrate material.

Probing structure 312 may include contacts such as conductive probe tips 324 configured to mate with corresponding contacts 228 on verification coupons 326. Probe tips 324 may be coupled to test connectors 320. Probe tips 324 may be coupled to test connectors 320 using any suitable radio-frequency transmission line formed within test fixture 310. Test signals may be conveyed to and from verification coupon 326 via such traces that are coupled to probe tips 314. In another suitable arrangement, probe tips 324 may be formed directly on test fixture 310.

Radio-frequency tester 304 in inspection test station 182 may be, for example, a vector network analyzer. Tester 304 may have a first port 316-1 to which a first radio-frequency cable 318-1 is connected and a second port 316-2 to which a second radio-frequency cable 316-2 is connected. Radio-frequency cables 318-1 and 318-2 may be, for example, coaxial cables. In particular, first cable 318-1 may have a first end that is connected to tester port 316-1 and a second end terminating at a first radio-frequency connector 320-1. Similarly, second cable 318-2 may have a first end that is connected to tester port 316-2 and a second end terminating at a second radio-frequency connector 320-2. Radio-frequency connectors 320-1 and 320-2 may be, for example, SubMiniature Version A (SMA) connectors or any other suitable radio-frequency connectors.

During testing operations, ports 316-1 and 316-2 of tester 304 may be coupled to conductive contacts 228 on verification coupon 326 (e.g., by touching probe tips 324 to conductive contacts 228). Radio-frequency tester 304 may receive commands from test host 302 via path 330 that direct tester 304 to gather desired radio-frequency measurements from calibration coupon 326. If desired, test data can be provided from tester 304 to test host 302 via path 330. When conductive contacts 228 are coupled to probe tips 324, circuitry 100 in verification coupon 326 may be electrically coupled to radio-frequency tester 304.

Tester 304 may be calibrated to remove potential errors that are associated with radio-frequency tester 304 and coaxial cables 318. Tester 304 may measure radio-frequency performance characteristics such as S parameters of circuitry 100 in verification coupon 326. The measured S parameters may be representative of the radio-frequency performance of inspection test station 182.

Assuming that systematic errors associated with inspection test station 182 have been removed (including errors associated with tester 304, ports 316, cables 318, radio-frequency connectors 320, test fixture 310, probing structure 312, and probe tips 324), the radio-frequency performance characteristics measured by inspection test station 182 may be compared to the baseline reference (e.g., baseline S parameters) determined by the calibrated master test station 200.

If measured radio-frequency performance characteristics (e.g., measured S parameters) do not acceptably match the baseline reference, the radio-frequency performance of the associated inspection test station 182 may be characterized as being unsatisfactory. An inspection test station 182 that has unsatisfactory radio-frequency performance may be labeled as a "failing" test station. If a measured performance characteristic acceptably matches the baseline performance characteristic, the radio-frequency performance of the associated inspection test station 182 may be characterized as satisfactory. An inspection test station 182 that has satisfactory radio-frequency performance may be labeled as a "passing" test station. An inspection test station 182 may be labeled as a "failing" test station if the associated radio-frequency performance characteristics measured by inspection test station 182 in response to testing one or more verification coupons 326 do not acceptably match the corresponding baseline reference.

A failing inspection test station 182 may be optionally calibrated (e.g., by providing the failing test station 182 with offset data generated by test host 202) to sufficiently match the measured radio-frequency performance characteristics to the baseline radio-frequency performance characteristics. For example, a failing inspection test station 182 may be calibrated by generating offset data with test host 202 to be supplied to tester 204.

Circuitry 100 on verification coupons 326 may include components that model radio-frequency characteristics (e.g., impedances) of components under test 180. For example, circuitry 100 in verification coupon 326 may include one or more capacitors, resistors, inductors, shorts, or any other suitable electric component connected together in series or shunt configurations between contacts 228 of verification coupon 326. Components in circuitry 100 may be formed so that circuitry 100 has selected impedance characteristics. The selected impedance characteristics may be chosen to match the impedance characteristics of a particular component under test 180.

A number of different verification coupons 326 each formed with respective circuitry 100 having different impedance characteristics may be sequentially measured by master test station 200 and inspection test stations 182. The impedance characteristics of circuitry 100 may be selected (e.g., by forming circuitry 100 with suitable electrical components) to allow master test station 200 and inspection test stations 182 to measure verification coupons 326 having a wide range of impedance characteristics. In general, measuring verification coupons 326 having a wide range of impedance characteristics ensures that inspection test stations 182 can perform accurate measurements on components under test having different impedance characteristics.

FIGS. 11A-11D are diagrams of verification coupons 326 formed with circuitry 100 having different electrical components arranged in a series configuration between signal contacts 228-1 (e.g., verification coupon 326 may have a first configuration of circuitry 100 shown by verification coupon 326-1 of FIG. 11A, verification coupon 326 may have a second configuration shown by verification coupon 326-2 of FIG. 11B, etc.). During test operations, test signals may be provided to/from signal contacts 228-1 (e.g., test signals may be received from tester 204 in master test station 200 and tester 304 in inspection test stations 182). Measuring verification coupons 326-1, 326-2, 326-3, and 326-4 with master test station 200 and inspection test stations 182 may provide testing for a wide range of impedance characteristics.

In one suitable embodiment of the present invention, circuitry 100 in verification coupon 326-1 may include a capacitive structure such as capacitor 332 connected in series between signal contacts 228-1 as shown in FIG. 11A. In another suitable arrangement of the present invention, circuitry 100 in verification coupon 326-2 may include an inductive structure such as inductor 334 connected in series between signal contacts 228-1 as shown in FIG. 11B. In another suitable arrangement, circuitry 100 in verification coupon 326-3 may include a resistive structure such as resistor 336 connected in series between signal contacts 228-1 as shown in FIG. 11C. In yet another suitable arrangement, verification coupon 326-4 may include a transmission line such as transmission line 338 connected between signal contacts 228-1 as shown in FIG. 11D. Transmission line 338 may be formed having a selected width W to provide transmission line 338 with suitable impedance.

Electrical components such as capacitor 332, inductor 334, resistor 336, and transmission line 338 in circuitry 100 may provide the associated verification coupon 326 with respective impedance. Master test station 200 and inspection test stations 182 may perform measurements on each of verification coupon 326-1, 326-2, 326-3, and 326-4 to characterize the performance of inspection test stations 182 at a wide range of tested impedances.

Figure 12C:
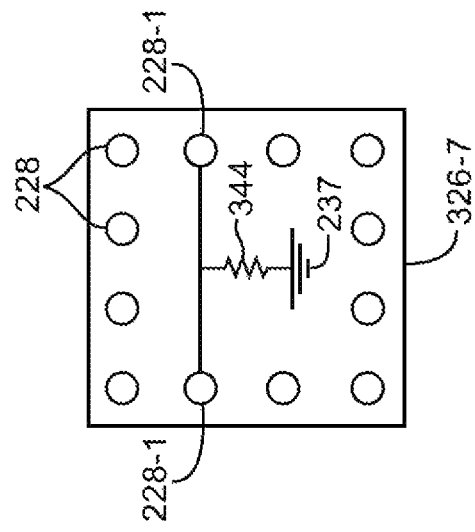
FIGS. 12A-12C are diagrams of verification coupons that may be formed having electrical components in a series configuration for testing inspection test stations at a wide range of impedances in accordance with an embodiment of the present invention.
Figure 12B:
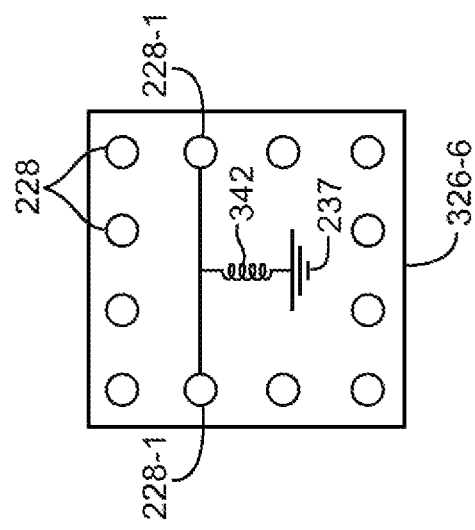
Figure 12A:
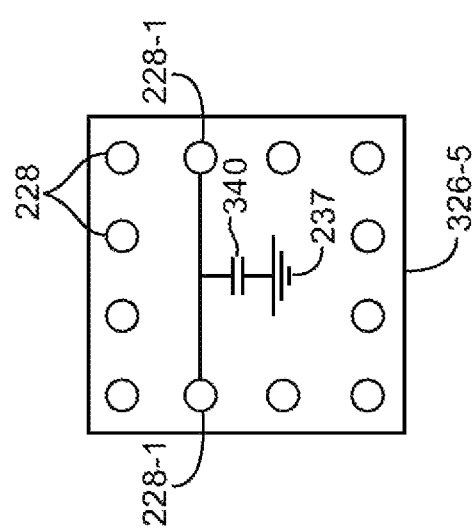

FIGS. 12A-12D are diagrams of verification coupons formed with circuitry 100 having different electrical components arranged in a shunt configuration between signal contacts 228-1 (e.g., verification coupon 326 may have a first configuration of circuitry 100 shown by verification coupon 326-5 of FIG. 12A, may have a second configuration shown by verification coupon 326-6 of FIG. 12B, etc.). During test operations, test signals may be provided to/from signal contacts 228-1 (e.g., test signals may be received from tester 204 in master test station 200 and tester 304 in inspection test stations 182). Measuring verification coupons 326-5, 326-6, and 326-7 with master test station 200 and inspection test stations 182 may provide testing for a wide range of impedance characteristics.

In one suitable embodiment of the present invention, circuitry 100 in verification coupon 326-5 may include a capacitive structure such as capacitor 340 connected in a shunt configuration between signal contacts 228-1 and ground 237 as shown in FIG. 12A. In another suitable arrangement, circuitry 100 in verification coupon 326-6 may include an inductive structure such as inductor 334 connected in a shunt configuration between signal contacts 228-1 and ground 237 as shown in FIG. 12B. In yet another suitable arrangement, circuitry 100 in calibration coupon 226-7 may include a resistive structure such as resistor 336 connected in a shunt configuration between signal contacts 228-1 and ground 237 as shown in FIG. 12C. Electrical components such as capacitor 340, inductor 342, and resistor 344 in circuitry 100 may provide the associated verification coupon 326 with respective impedance. Master test station 200 and inspection test stations 182 may perform measurements on each of verification coupon 326-5, 326-6, and 326-7 to characterize the performance of inspection test stations 182 at a wide range of impedance characteristics.

Inspection test station 182 may measure radio-frequency characteristics of verification coupon 326 such as S parameters for each configuration of verification coupon 326 shown in FIGS. 11 and 12 (e.g., for verification coupons 326-1, 326-2, etc.). The measured S parameters for each configuration of verification coupon 326 may be compared to baseline S parameters determined by calibrated master test station 200 to characterize the performance of inspection test station 182.

Verification coupons 326 of FIGS. 11 and 12 are merely illustrative. If desired, circuitry 100 in verification coupons 326 may include other components such as variable capacitors, variable resistive loads, variable inductors, radio-frequency switches, or any other suitable components. Circuitry 100 in verification coupons 326 may be formed with any number and combination of capacitors, resistors, inductors, and transmission lines connected in series or shunt configurations between any number of contacts 228 and ground 237 so that verification coupons 326 have suitable impedance characteristics.

Figure 13:
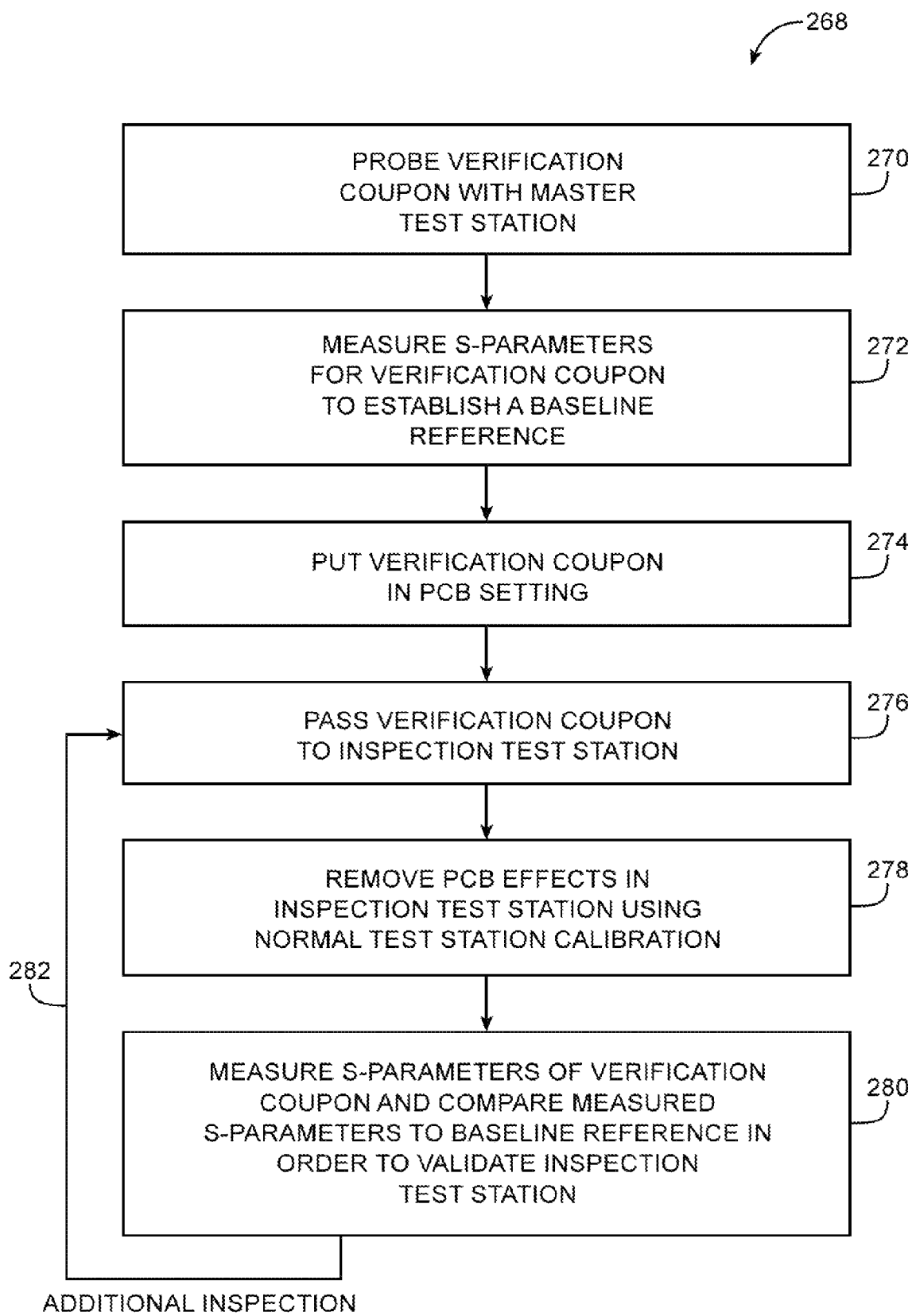
FIG. 13 is a flow chart of illustrative steps for testing the performance of inspection test stations using verification coupons in accordance with an embodiment of the present invention.

A flow chart of illustrative steps for testing inspection test stations such as inspection test station 182 of FIG. 10 is shown in FIG. 13. In testing inspection test station 182, it may be desirable to separate the effects associated with the transmission medium (e.g., the effects associated with test cables 318, test fixture 310, probe structure 312, and probe contacts 324) from circuitry 100 in verification coupons 326. At radio-frequencies, systematic effects such as signal leakage and impedance mismatch can affect measured data. In a stable test environment, such types of systematic effects are repeatable and can be characterized and removed via calibration.

At step 270 (i.e., after calibrating master test station 200), calibrated master test station 200 may probe verification coupon 326 by coupling probe contacts 224 (FIG. 5) to contacts 228 on verification coupon 326.

At step 272, calibrated master test station 200 may measure radio-frequency performance characteristics such as S parameters of verification coupon 326. The S parameters measured by master test station 200 may establish baseline S parameters for the associated verification coupon 326. The baseline S parameters may be used to test inspection test stations 182 in manufacturing system 178 (FIG. 3).

At step 274, verification coupon 326 may be mounted to a support structure such as coupon support structure 308 (e.g., a printed circuit board).

At step 276, verification coupon 326 mounted to coupon support structure 308 may be passed to a selected inspection test station 182 (e.g., verification coupon 326 may be passed to inspection test station 182-1, inspection test station 182-2, etc.). Contacts 228 in verification coupon 326 may couple to probe tips 324 of inspection test station 182 during testing.

At step 278, radio-frequency tester 304 may be calibrated to remove potential errors that are associated with radio-frequency tester 304, coaxial cables 318 (i.e., cables 318-1 and 318-2), test fixture 310, probe structure 312, and probe tips 324 using step 250 of FIG. 7 (e.g., by using the TRL approach or any other suitable calibration procedure). In another suitable arrangement, step 278 is performed prior to step 270. Once this step is complete, measurements gathered using tester 304 will only reflect the behavior of structures coupled to probe tips 324 (e.g., ports 316-1 and 316-2 of tester 304 are virtually extended to the ends of probe tips 324 so that a new reference plane 322 is established as shown in FIG. 10).

At step 280, inspection test station 280 may measure radio-frequency performance characteristics such as S parameters of the mounted verification coupon 326. The S parameters measured by inspection test station 182 may be compared to the baseline S parameters determined by master test station 200 during step 272.

If the S parameters measured by inspection test station 182 do not acceptably match the baseline S parameters, inspection test station 182 may be labeled as a "failing" test station. If the S parameters measured by inspection test station 182 acceptably match the baseline S parameters, inspection test station 182 may be labeled as a "passing" test station.

If inspection test stations 182 in manufacturing system 178 remain to be tested using a given verification coupon 326, processing may loop back to step 276 as shown by path 282. If no inspection test stations 182 remain to be tested using the given verification coupon 326, inspection test station 182 may test the performance of additional verification coupons 326. For example, verification coupon 326-1 having a capacitor connected in series between signal contacts 228-1 (see FIGS. 11A-11D) may be used to test the radio-frequency performance of inspection test stations 182. Once test operations are complete, verification coupon 326-2 having an inductor connected in series between two contacts 228 may be used to test the radio-frequency performance of inspection test stations 182. In this way, the radio-frequency performance of each inspection test station 182 in manufacturing system 178 may be tested using a number of verification coupons having different impedance characteristics.

Master test system 200, inspection test system 182, calibration coupons 226, and verification coupons 326 of FIGS. 3-13 are merely illustrative. If desired, master test system 200 may include a test fixture such as test fixture 310 and probing structures such as probing structure 312 of FIG. 10 for measuring the baseline S parameters of verification coupons 326. Calibration coupons 226 and verification coupons 326 may have any number of contacts 228. Master test system 200 and inspection test stations 182 may measure any suitable radio-frequency performance characteristic associated with calibration coupons 226 and verification coupons 326. Master test station 200 may measure radio-frequency performance characteristics of a given verification coupon 326 while another verification coupon is being measured by inspection test stations 182. Verification coupons 326 may be supplied to inspection test stations 182 by master test station 200 for measurement in parallel.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of validating a plurality of inspection test stations, the method comprising:
   with a plurality of calibration reference structures, calibrating at least one master test station that is different from the plurality of inspection test stations;
   testing a plurality of verification reference structures with the at least one master test station after calibrating the at least one master test station with the plurality of calibration reference structures; and
   using the plurality of verification reference structures that have been tested with the at least one master test station, determining whether each inspection test station in the plurality of inspection test stations has satisfactory performance.

2. The method defined in claim 1, wherein the verification reference structures comprise impedance modeling circuitry and conductive contacts formed on a substrate, the method further comprising:
removing systematic errors associated with the substrate and the conductive contacts of the verification reference structures by calibrating the at least one master test station with the plurality of calibration reference structures.

3. The method defined in claim 1, wherein determining whether each inspection test station in the plurality of inspection test stations has satisfactory performance comprises:
with each inspection test station in the plurality of inspection test stations, providing test signals to the verification reference structures; and
with each inspection test station in the plurality of inspection test stations, measuring scattering parameters associated with the verification reference structures.

4. The method defined in claim 1, further comprising:
obtaining baseline measurement data by testing the plurality of verification reference structures with the at least one master test station;
obtaining test measurement data by testing the plurality of verification test structures with each inspection test station in the plurality of inspection test stations; and
comparing the test measurement data to the baseline measurement data to determine whether each inspection test station in the plurality of inspection test stations has satisfactory performance.

5. The method defined in claim 4, wherein each inspection test station in the plurality of inspection test stations includes a vector network analyzer and a test fixture and determining whether each inspection test station in the plurality of inspection test stations has satisfactory performance comprises:
removing systematic errors associated with the vector network analyzer and the test fixture of each inspection test station in the plurality of inspection test stations prior to comparing the test measurement data to the baseline measurement data.

6. The method defined in claim 1, wherein each inspection test station in the plurality of inspection test stations includes a test host, the method further comprising:
with the test host, generating offset data to calibrate an inspection test station in the plurality of inspection test stations that has unsatisfactory performance.

7. The method defined in claim 1, wherein the calibration reference structures each include a transmission line structure and calibrating the at least one master test station comprises:
with the at least one master test station, measuring radio-frequency characteristics associated with the transmission line structure.

8. The method defined in claim 7, wherein each calibration reference structure has a respective transmission line structure and measuring the radio-frequency characteristics associated with the transmission line structure comprises:
measuring the radio-frequency characteristics of the respective transmission line structure in each of the plurality calibration reference structures.

9. The method defined in claim 8, further comprising:
measuring the radio-frequency characteristics of the respective transmission line structure in each calibration reference structure using a THRU-REFLECT-LINE (TRL) approach.

10. The method defined in claim 7, wherein the radio-frequency characteristics include scattering parameters associated with the calibration reference structures and calibrating the at least one master test station further comprises:
measuring the scattering parameters associated with calibration reference structures using the at least one master test station.

11. A method of calibrating a master test station, the method comprising:
sequentially coupling the master test station to each passive reference test structure of a plurality of passive reference test structures;
with the master test station, obtaining calibration measurement data by testing each of the passive reference test structures of the plurality of passive reference test structures while the passive reference test structures are coupled to the master test station; and
calibrating the master test station using calibration data generated by comparing the obtained calibration measurement data to reference data.

12. The method defined in claim 11, wherein obtaining the calibration measurement data comprises:
with the master test station, measuring radio-frequency characteristics associated with each passive reference test structure in the plurality of passive reference test structures.

13. The method defined in claim 12, wherein the reference data includes predetermined radio-frequency characteristics associated with each passive reference test structure in the plurality of passive reference test structures and comparing the calibration measurement data to the reference data comprises:
comparing the measured radio-frequency characteristics to the predetermined radio-frequency characteristics.

14. The method defined in claim 12, further comprising:
with an additional master test station, measuring radio-frequency characteristics associated with each passive reference test structure in the plurality of passive reference test structures to obtain additional test data, wherein comparing the calibration measurement data to the reference data comprises comparing the calibration measurement data the to the additional test data.

15. The method defined in claim 13, wherein the measured radio-frequency characteristics comprise scattering parameters associated with each passive reference test structure in the plurality of passive reference test structures and the predetermined radio-frequency characteristics comprise predetermined scattering parameters associated with each passive reference test structure in the plurality of passive reference test structures, the method further comprising:
comparing the measured scattering parameters to the predetermined scattering parameters.

16. A method of validating a plurality of inspection test stations, the method comprising:
sequentially coupling each inspection test station of the plurality of inspection test stations to each passive reference test structure of a plurality of passive reference test structures;
with each inspection test station in the plurality of inspection test stations, obtaining verification measurement data by performing radio-frequency testing on each of the passive reference test structures of the plurality of passive reference test structures while each of the passive reference test structures of the plurality of passive reference test structures is coupled to that inspection test station; and determining whether each inspection test station in the plurality of inspection test stations has satisfactory performance by comparing the verification measurement data to reference data.

17. The method defined in claim 16, wherein the reference data is generated by a master test station using the plurality of passive reference test structures and determining whether each inspection test station in the plurality of inspection test stations has satisfactory performance comprises:

comparing the verification measurement data to reference data generated by the master test station.

18. The method defined in claim 16, wherein obtaining the verification measurement data comprises:

with the inspection test stations, measuring scattering parameters associated with each passive reference test structure in the plurality of passive reference test structures.

19. The method defined in claim 18, wherein the passive reference test structures include circuitry and conductive contacts coupled to the circuitry, the circuitry comprises one or more electrical components connected between the conductive contacts in a shunt configuration, and measuring the scattering parameters associated with each passive reference test structure comprises:

measuring the scattering parameters associated with the one or more electrical components connected between the conductive contacts in the shunt configuration.

20. The method defined in claim 18, wherein the passive reference test structures include circuitry and conductive contacts coupled to the circuitry, the circuitry comprises one or more electrical components connected between the conductive contacts in a series configuration, and measuring the scattering parameters associated with each passive reference test structure comprises:

measuring the scattering parameters associated with the one or more electrical components connected between the conductive contacts in the series configuration.

\* \* \* \* \*